United States Patent
Arakane et al.

(10) Patent No.: US 8,035,297 B2
(45) Date of Patent: Oct. 11, 2011

(54) ORGANIC ELECTROLUMINESCENT DEVICE WITH CARRIER BLOCKING LAYER INTERPOSED BETWEEN TWO EMITTING LAYERS

(75) Inventors: Takashi Arakane, Sodegaura (JP);
Hitoshi Kuma, Sodegaura (JP);
Hisayuki Kawamura, Sodegaura (JP);
Toshihiro Iwakuma, Sodegaura (JP);
Chishio Hosokawa, Sodegaura (JP)

(73) Assignee: Idemitsu Kosan Co., Ltd., Tokyo (JP)

( * ) Notice: Subject to any disclaimer, the term of this patent is extended or adjusted under 35 U.S.C. 154(b) by 0 days.

(21) Appl. No.: 12/768,223

(22) Filed: Apr. 27, 2010

(65) Prior Publication Data
US 2010/0200848 A1   Aug. 12, 2010

Related U.S. Application Data

(63) Continuation of application No. 10/575,092, filed as application No. PCT/JP2005/04486 on Mar. 15, 2005, now Pat. No. 7,737,625.

(30) Foreign Application Priority Data

Mar. 25, 2004   (JP) .................................. 2004-088463

(51) Int. Cl.
*H05B 33/00* (2006.01)
(52) U.S. Cl. .................. 313/504; 428/690; 313/506
(58) Field of Classification Search .......... 313/503–512; 428/690
See application file for complete search history.

(56) References Cited

U.S. PATENT DOCUMENTS

| | | | |
|---|---|---|---|
| 5,554,220 | A | 9/1996 | Forrest et al. |
| 5,703,436 | A | 12/1997 | Forrest et al. |
| 5,707,745 | A | 1/1998 | Forrest et al. |
| 6,303,238 | B1 | 10/2001 | Thompson et al. |
| 6,830,828 | B2 | 12/2004 | Thompson et al. |
| 7,022,421 | B2 | 4/2006 | Thompson et al. |
| 2004/0032214 | A1 | 2/2004 | Lee et al. |
| 2004/0113543 | A1 | 6/2004 | Daniels |
| 2004/0183082 | A1 | 9/2004 | Yamazaki |
| 2005/0006642 | A1 | 1/2005 | Tung et al. |
| 2005/0025881 | A1 | 2/2005 | Daniels |
| 2005/0199901 | A1 | 9/2005 | Ueda |

(Continued)

FOREIGN PATENT DOCUMENTS

JP   8-78163   3/1996

(Continued)

OTHER PUBLICATIONS

Tokito, Shizuo et al., "High-efficiency white phosphorescent organic light-emitting devices with greenish-blue and red-emitting layers", Applied Physics Letters, vol. 83, No. 12, pp. 2459-2461, 2003.

*Primary Examiner* — Joseph L Williams
(74) *Attorney, Agent, or Firm* — Oblon, Spivak, McClelland, Maier & Neustadt, L.L.P.

(57) ABSTRACT

An organic electroluminescent device including in sequence an anode, a first emitting layer (5), a carrier barrier layer (6), a second emitting layer (7) and a cathode stacked; wherein the ionization potential of the carrier barrier layer (6) is more than the ionization potential of the first emitting layer (5) by 0.1 eV or more and the affinity level of the carrier barrier layer (6) is less than the affinity levels of the first emitting layer (5) and the second emitting layer (7) by 0.1 eV or more.

18 Claims, 3 Drawing Sheets

| U.S. PATENT DOCUMENTS | | | | FOREIGN PATENT DOCUMENTS | | |
|---|---|---|---|---|---|---|
| 2005/0282036 A1 | 12/2005 | D'Andrade et al. | JP | 11-329734 | 11/1999 |
| 2006/0006375 A1 | 1/2006 | Ou et al. | JP | 2001-313180 | 11/2001 |
| 2006/0008672 A1 | 1/2006 | Jarikov | JP | 2002-313553 | 10/2002 |
| 2006/0081832 A1 | 4/2006 | Chen | JP | 2003-59670 | 2/2003 |
| 2006/0134460 A1 | 6/2006 | Kondakova et al. | JP | 2003-171385 | 6/2003 |
| 2006/0141287 A1 | 6/2006 | Klubek et al. | JP | 2003-272857 | 9/2003 |
| 2006/0232194 A1 | 10/2006 | Tung et al. | JP | 2005-150082 | 6/2005 |
| 2006/0237733 A1 | 10/2006 | Yamada | WO | 03/022008 | 3/2003 |
| 2006/0273714 A1 | 12/2006 | Forrest et al. | WO | WO 03/022007 A1 | 3/2003 |
| 2006/0279203 A1 | 12/2006 | Forrest et al. | WO | 03/059015 | 7/2003 |

(a)

(b)

(c)

(d)

D = DPVDPAN

ORGANIC ELECTROLUMINESCENT DEVICE WITH CARRIER BLOCKING LAYER INTERPOSED BETWEEN TWO EMITTING LAYERS

CROSS-REFERENCE TO RELATED APPLICATIONS

This application is a continuation application of prior U.S. patent application Ser. No. 10/575,092, the disclosure of which is incorporated by reference in its entirety. U.S. Ser. No. 10/575,092 is a National Stage of PCT/JP05/04486 filed on Mar. 15, 2005 which claims the benefit of priority under 35 U.S.C. §119 from Japanese Patent Application No. 2004-088463, filed Mar. 25, 2004, the disclosures of which are incorporated herein by reference in their entireties.

TECHNICAL FIELD

The invention relates to an organic electroluminescent device (hereinafter referred to as organic EL device).

BACKGROUND ART

Recently, white organic EL devices are being actively developed because they can be used for a mono-color display device, a lighting apparatus such as a back light, and a full-color display with color filters. In the case where white organic EL devices are used for lighting applications, they are required to have a high luminous efficiency, for example, which is equivalent to or more than that of fluorescent lamps.

Many methods of producing white light emission by an organic EL device have been disclosed. Few of the methods produce white light with only one kind of emitting material and a single organic EL device generally uses two or more kinds of emitting materials that emit light simultaneously. In the case of using two kinds of emitting materials, a blue emitting material and a yellow-to-red emitting material, yellow-to-red being the complementary color to blue, are selected. However, the yellow-to-red light emission becomes dominant in many cases, thereby yielding a reddish white color.

JP-A-2003-272857 proposes a white organic EL device in which the tendency for red to be strong in emitted light is negated by using a blue emitting layer as an emitting layer on the anode side, the emission range of which tends to be offset in the type where an emitting layer is divided into two layers, and whose color change is suppressed. The level of the luminous efficiency was, however, not necessarily enough.

Further, JP-A-08-078163 discloses a structure having a carrier-recombination-region-control layer interposed between a hole transporting layer and an electron-transporting layer, in which there is obtained white emission having luminous efficiency that is high to some extent although it is not necessarily at a practically sufficient level. Since, however, the affinity level of the above carrier-recombination-region-control layer has a large value relative to the affinity level of the hole transporting layer, the driving voltage is high, and with the passage of the driving time, it comes to be difficult to inject electrons into the hole transporting layer. As a result, the blue emission intensity is decreased, and the emission is liable to be shifted toward red light.

It is an object of the invention to provide an organic EL device with a high luminous efficiency and small change in chromaticity.

DISCLOSURE OF THE INVENTION

Through research for solving the foregoing subjects, the inventors found that an organic EL device with a high luminous efficiency and small change in chromaticity can be obtained by interposing an electron barrier layer between two organic emitting layers and controlling the energy levels thereof, and completed the invention.

The invention provides the following organic EL device.

1. An organic electroluminescent device comprising in sequence an anode, a first emitting layer, a carrier barrier layer, a second emitting layer and a cathode stacked;
   wherein the ionization potential of the carrier barrier layer is more than the ionization potential of the first emitting layer by 0.1 eV or more and the affinity level of the carrier barrier layer is less than the affinity levels of the first emitting layer and the second emitting layer by 0.1 eV or more.

2. The organic electroluminescent device according to 1, wherein the ionization potential of the carrier barrier layer is more than the ionization potential of the first emitting layer by 0.2 eV or more and the affinity level of the carrier barrier layer is less than the affinity levels of the first emitting layer and the second emitting layer by 0.2 eV or more.

3. An organic electroluminescent device comprising in sequence an anode, a first emitting layer, a first carrier barrier layer, a second carrier barrier layer, a second emitting layer and a cathode stacked;
   wherein the ionization potential of the first carrier barrier layer is more than the ionization potential of the first emitting layer by 0.1 eV or more and the affinity level of the second carrier barrier layer is less than the affinity level of the second emitting layer by 0.1 eV or more.

4. The organic electroluminescent device according to 3, wherein the ionization potential of the first carrier barrier layer is more than the ionization potential of the first emitting layer by 0.2 eV or more and the affinity level of the second carrier barrier layer is less than the affinity level of the second emitting layer by 0.2 eV or more.

5. The organic electroluminescent device according to any one of 1 to 4, wherein the first emitting layer comprises a first dopant for a first emission color and the second emitting layer comprises a second dopant for a second emission color.

6. The organic electroluminescent device according to any one of 1 to 5, wherein at least one carrier barrier layer comprises a third dopant for a third emission color.

7. The organic electroluminescent device according to any one of 1 to 6, wherein the first, second and third dopants are selected from blue, green or red.

8. The organic electroluminescent device according to any one of 1 to 7, wherein the first emitting layer emits blue or red light.

9. The organic electroluminescent device according to any one of 1 to 7, wherein the second emitting layer emits blue or red light.

10. The organic electroluminescent device according to any one of 1 to 7, wherein one of the first emitting layer and the second emitting layer emits blue light, and the other emitting layer emits red light.

11. The organic electroluminescent device according to any one of 1 to 10, wherein the first emitting layer comprises a hole-transporting material and the second emitting layer comprises an electron-transporting material.

12. The organic electroluminescent device according to any one of 1 to 11, wherein the hole mobility of the first emitting layer is $10^{-5}$ cm$^2$/v·s or more and the electron mobility of the second emitting layer is $10^{-6}$ cm$^2$/v·s or more.

13. The organic electroluminescent device of any one of 1 to 11 that emits white light.

According to the invention, there can be provided an organic EL device, particularly a white organic EL device, with a high luminous efficiency and small change in chromaticity.

BEST MODES FOR WORKING THE INVENTION

Embodiment 1

Figure 1:
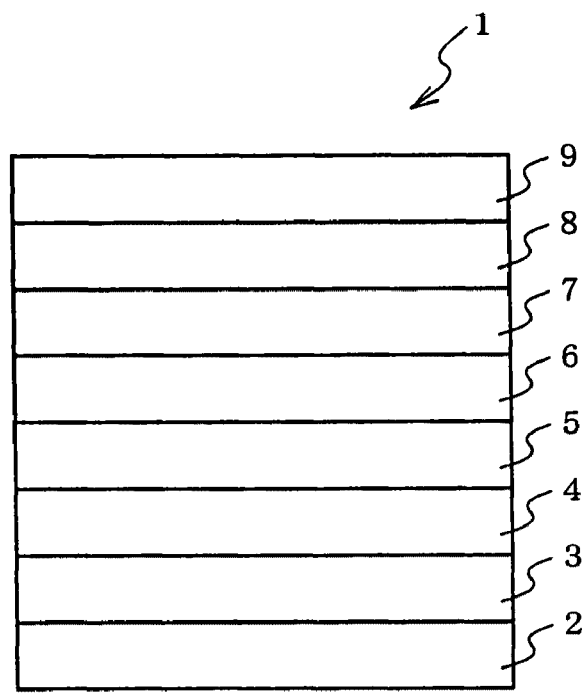
FIG. 1 is a diagram showing the constitution of a white organic EL device of Embodiment 1.
Figure 2:
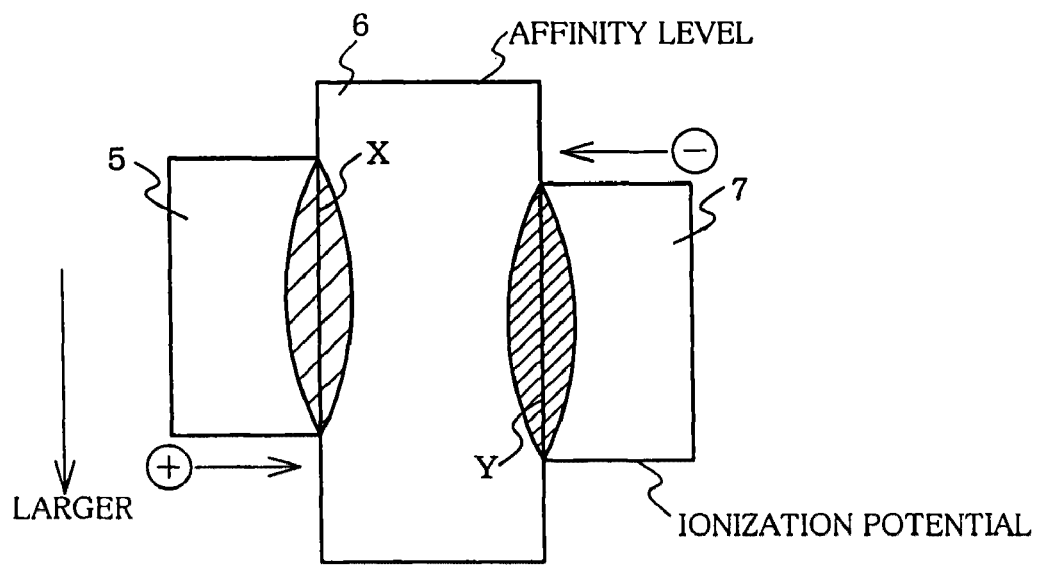
FIG. 2 is an energy level diagram of a first emitting layer, an electron barrier layer and a second emitting layer in Embodiment 1.

FIG. 1 is a diagram showing the constitution of a white organic EL device according to one embodiment of the invention. FIG. 2 is an energy level diagram of a first emitting layer, an electron barrier layer and a second emitting layer in this organic EL device.

As shown in FIG. 1, a white organic EL device 1 has a structure in which an anode 2, a hole injecting layer 3, a hole transporting layer 4, a first emitting layer 5, an electron barrier layer 6, a second emitting layer 7, an electron-transporting layer 8 and a cathode 9 are stacked. The first emitting layer 5 contains a first host material and a first dopant, and the second emitting layer 7 contains a second host material and a second dopant.

In the device 1, white emission is obtained using the first emitting layer 5 for blue emission and using the second emitting layer 7 for red emission.

FIG. 2 shows energy levels of the first emitting layer 5, electron barrier layer 6 and second emitting layer 7 of the organic EL device 1. In this Figure, upper sides represent the affinity level of electrons, and lower sides represent ionization potential. In the energy level diagram, a lower portion exhibits a greater value.

The ionization potential of the electron barrier layer 6 is greater than that of the first emitting layer 5 by at least 0.1 eV, preferably by at least 0.2 eV, more preferably by at least 0.3 eV. The affinity level of the electron barrier layer 6 is lower than those of the first emitting layer 5 and the second emitting layer 7 by at least 0.1 eV, preferably by at least 0.2 eV, more preferably at least 0.3 eV.

In FIG. 2, holes transported from the anode 2 (not shown) through the hole injecting layer 3 (not shown) and the hole transporting layer 4 (not shown) are injected into the first emitting layer 5. Since, however, the electron barrier layer 6 constitutes a barrier, the holes are localized in a place X around the electron barrier layer 6. However, some holes move to the second emitting layer 7 through the electron barrier layer 6. On the other hand, electrons transported from the cathode 9 (not shown) through the electron-transporting layer 8 (not shown) are injected into the second emitting layer 7. Since, however, the electron barrier layer 6 constitutes a barrier, the electrons are localized in a place Y around the electron barrier layer 6. However, some electrons move to the first emitting layer 5 through the electron barrier layer 6. Therefore, the first emitting layer 5 and the second emitting layer 7 emit light particularly in the places X and Y around the electron barrier layer where holes or electrons are localized.

When the first emitting layer 5 is constituted from a material capable of transporting holes, holes injected from the hole transporting layer 4 come to be easily transported to the place X in and in the vicinity of the electron barrier layer 6. When the second emitting layer 7 is constituted from a material capable of transporting electrons, electrons injected from the electron-transporting layer 8 come to be easily transported to the place Y in and in the vicinity of the electron barrier layer 6. Preferably, the first emitting layer 5 has a hole mobility of at least $10^{-5}$ cm$^2$/v·s, and the second emitting layer 7 has an electron mobility of at least $10^{-6}$ cm$^2$/v·s. The hole or electron mobility is measured by a "time of flight" method.

In the white organic EL device 1 of this Embodiment, the electron barrier layer 6 is present between the two emitting layers 5 and 7, and the energy level of the electron barrier layer 6 is controlled whereby the two emitting layers 5 and 7 hence emit light efficiently, so that high luminous efficiency can be realized. Since this white organic EL device has practical luminous efficiency, it can be suitably used in an information display, display equipment for automobile use, lighting fixtures, and the like.

In this Embodiment, the first emitting layer 5 is used for blue emission, and the second emitting layer 7 is used for red emission, but they may be used in a reverse manner. The first host material and first dopant of the first emitting layer 5 may be the same as, or different from, the second host material and second dopant of the second emitting layer 7, respectively, and they can be selected as required.

Further, the electron barrier layer 6 may contain a third dopant that may be the same as, or different from, the first and second dopants. When the electron barrier layer 6 contains a third dopant, there can be realized a device with a small change in chromaticity.

Preferably, the first, second and third dopants are selected from blue, green or red series that exhibit a yellow to orange or red color. When they are selected in the above manner, the white chromaticity is easily adjusted, and there can be realized a device with a small change in chromaticity.

In the invention, preferably, the emission maximum wavelength in blue emission is 450 to 500 nm, the emission maximum wavelength in green emission is 500 to 550 nm, and the emission maximum wavelength in red emission is 550 to 650 nm.

Embodiment 2

Figure 3:
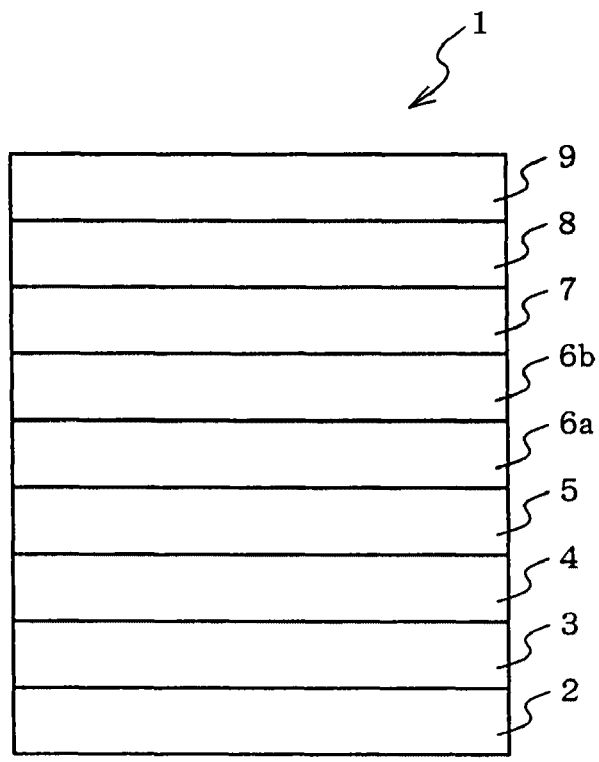
FIG. 3 is a diagram showing the constitution of a white organic EL device of Embodiment 2.
Figure 4:
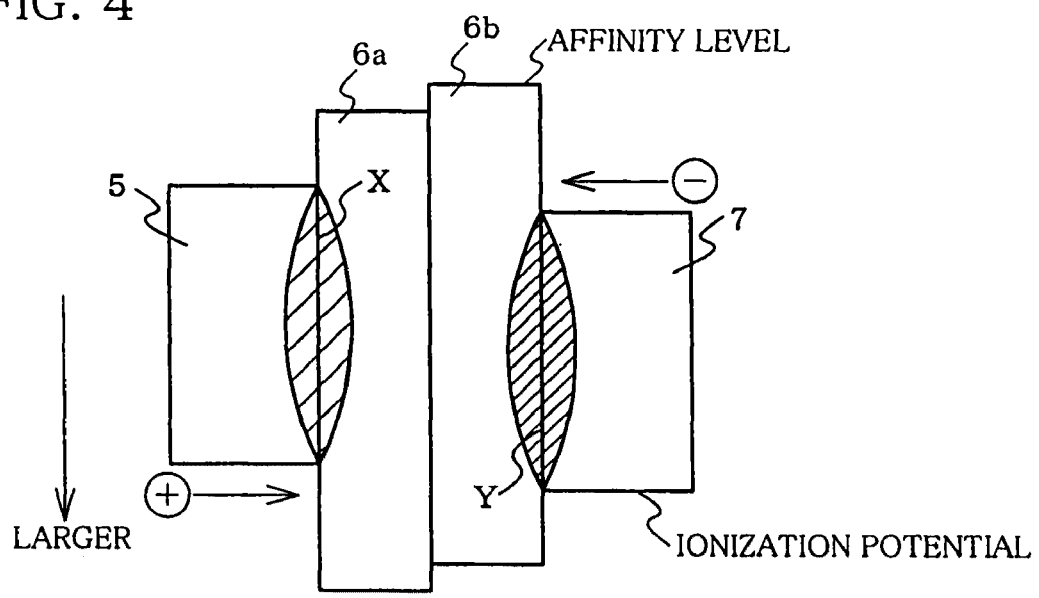
FIG. 4 is an energy level diagram of a first emitting layer, a first electron barrier layer, a second electron barrier layer and a second emitting layer in Embodiment 2.

FIG. 3 is a diagram showing the constitution of a white organic EL device according to another embodiment of the invention. FIG. 4 is an energy level diagram of a first emitting layer, a first electron barrier layer, a second electron barrier layer and a second emitting layer in the organic EL device.

As shown in FIG. 3, this Embodiment is an embodiment in which the electron barrier layer 6 of Embodiment 1 is replaced with a plurality of electron barrier layers 6a and 6b.

As shown in FIG. 4, the ionization potential of the electron barrier layer 6a is greater than that of the first emitting layer 5 by at least 0.1 eV, preferably by at least 0.2 eV, and the affinity level of the electron barrier layer 6b is lower than that of the second emitting layer 7 by at least 0.1 eV, preferably by at least 0.2 eV.

When such a plurality of electron barrier layers are provided, there can be realized a device having higher luminous efficiency.

While this Embodiment has two electron barrier layers, three or more electron barrier layers may be provided. In this case, the electron barrier layer nearest the anode constitutes a first electron barrier layer, and the electron barrier layer nearest the cathode constitutes a second electron barrier layer.

As described above, the invention has a constitution in which the anode, the first emitting layer, the electron barrier layer, the second emitting layer and the cathode are stacked in this order. The electron barrier layer may be formed of a plurality of layers. In the invention, another organic layer or inorganic layer may be interposed between the anode and the first emitting layer or between the second emitting layer and the cathode. The interposing layer is not limited so long as it can transport electrons and holes. When the interposing layer is present in the direction in which light is taken out, preferably, it is transparent. Examples of suitable organic EL devices of the invention include the following constitutions.

Anode/first emitting layer/electron barrier layer/second emitting layer/cathode, Anode/hole transporting layer/first emitting layer/electron barrier layer/second emitting layer/cathode, Anode/first emitting layer/electron barrier layer/second emitting layer/electron-transporting layer/cathode, Anode/hole transporting layer/first emitting layer/electron barrier layer/second emitting layer/electron-transporting layer/cathode, Anode/hole injecting layer/hole transporting layer/first emitting layer/electron barrier layer/second emitting layer/electron-transporting layer/cathode, Anode/hole injecting layer/hole transporting layer/first emitting layer/electron barrier layer/second emitting layer/electron-transporting layer/electron-injecting layer/cathode, Anode/first emitting layer/first electron barrier layer/second electron barrier layer/second emitting layer/cathode, Anode/hole transporting layer/first emitting layer/first electron barrier layer/second electron barrier layer/second emitting layer/cathode, Anode/first emitting layer/first electron barrier layer/second electron barrier layer/second emitting layer/electron-transporting layer/cathode, Anode/hole transporting layer/first emitting layer/first electron barrier layer/second electron barrier layer/second emitting layer/electron-transporting layer/cathode, Anode/hole injecting layer/hole transporting layer/first emitting layer/first electron barrier layer/second electron barrier layer/second emitting layer/electron-transporting layer/cathode, Anode/hole injecting layer/hole transporting layer/first emitting layer/first electron barrier layer/second electron barrier layer/second emitting layer/electron-transporting layer/electron-injecting layer/cathode.

The invention will be explained below mainly with regard to the electron barrier layer, blue emitting layer and red emitting layer which are characteristic portions of the invention. The red light as used herein means light of a yellow color to an orange color or a red color. In the invention, materials for the electron barrier layer and the emitting layer are selected such that the electron barrier layer and the emitting layer have certain energy levels. The constitutions and production methods of other organic layer, inorganic compound layer, anode, cathode, etc., will be briefly explained since general constitutions can be employed therefor.

1. Electron Barrier Layer

The electron barrier layer is a layer for restricting the injection of holes from an organic emitting layer near the anode to an organic emitting layer near the cathode and restricting the injection of electrons from an organic emitting layer near the cathode to an organic emitting layer near the anode, and the electron barrier layer is provided for adjusting the emission quantity of each emitting layer.

When a single electron barrier layer is used, the material constituting the electron barrier layer has an ionization potential that is greater than the ionization potential of the organic emitting layer near the anode by at least 0.1 eV, and the electron barrier layer has an affinity level that is lower than the affinity level of any organic emitting layer by at least 0.1 eV. The difference in the ionization potential or the affinity level is preferably at least 0.2 eV.

Further, a plurality of electron barrier layers may be stacked. In this case, the electron barrier layer nearest the anode has an ionization potential that is greater than the ionization potential of the organic emitting layer near the anode by at least 0.1 eV, and the electron barrier layer nearest the cathode has an affinity level that is lower than the affinity level of the organic layer near the cathode by at least 0.1 eV. The difference in the ionization potential or the affinity level is preferably at least 0.2 eV.

Although not specially limited, the thickness of the electron barrier layer is preferably 0.1 to 50 nm, more preferably 0.1 to 10 nm.

For the electron barrier layer, various organic compounds and inorganic compounds can be used. The organic compounds include tertiary amine compounds, carbazole derivatives, nitrogen-containing heterocyclic compounds and metal complexes. The inorganic compounds include oxides, nitrides, composite oxides, sulfides and fluorides of metals such as Ba, Ca, Sr, Yb, Al, Ga, In, Li, Na, K, Cd, Mg, Si, Ta, Ge, Sb, Zn, Cs, Eu, Y, Ce, W, Zr, La, Sc, Rb, Lu, Ti, Cr, Ho, Cu, Er, Sm, W, Co, Se, Hf, Tm, Fe and Nb.

The electron barrier layer may contain a blue, green or red dopant which will be explained below.

2. Emitting Layer (1) Blue Emitting Layer

The blue emitting layer is preferably an emitting layer having an emission maximum wavelength of 450 to 500 nm, and comprises a host material and a blue dopant. The host material is preferably a styryl derivative, arylene derivative or aromatic amine. The styryl derivative is particularly preferably at least one selected from distyryl derivatives, tristyryl derivatives, tetrastyryl derivatives and styrylamine derivatives. The arylene derivative is particularly preferably an anthracene derivative, especially a compound that contains arylanthracene skeleton. The aromatic amine is preferably a compound containing 2 to 4 nitrogen atoms substituted with an aromatic group. Particularly preferred is a compound containing 2 to 4 nitrogen atoms substituted with an aromatic group and at least one alkenyl group.

The styryl and anthracene derivatives include compounds represented by the following formulas [1] to [6] and the aromatic amines include compounds represented by the following formulas [7] to [8].

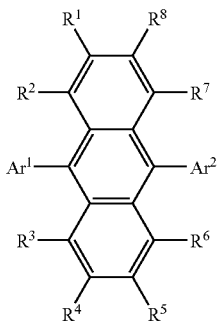

[1]

wherein $R^1$ to $R^8$ are independently a hydrogen atom, a halogen atom, a cyano group, a nitro group, a substituted or unsubstituted alkyl group with 1 to 20 carbon atoms, a substituted or unsubstituted alkoxy group with 1 to 20 carbon atoms, a substituted or unsubstituted aryloxy group with 6 to 30 carbon atoms, a substituted or unsubstituted alkylthio group with 1 to 20 carbon atoms, a substituted or unsubstituted arylthio group with 6 to 30 carbon atoms, a substituted or unsubstituted arylalkyl group with 7 to 30 carbon atoms, a substituted or unsubstituted monocyclic group with 5 to 30 carbon atoms, a substituted or unsubstituted condensed polycyclic group with 10 to 30 carbon atoms or a substituted or unsubstituted hetrocyclic group with 5 to 30 carbon atoms; and $Ar^1$ and $Ar^2$ are independently a substituted or unsubstituted aryl group with 6 to 30 carbon atoms or a substituted or unsubstituted alkenyl group, a substituent is a substituted or unsubstituted alkyl group with 1 to 20 carbon atoms, a substituted or unsubstituted alkoxy group with 1 to 20 carbon atoms, a substituted or unsubstituted aryloxy group with 6 to 30 carbon atoms, a substituted or unsubstituted alkylthio group with 1 to 20 carbon atoms, a substituted or unsubstituted arylthio group with 6 to 30 carbon atoms, a substituted or unsubstituted arylalkyl group with 6 to 30 carbon atoms, a substituted or unsubstituted monocyclic group with 5 to 30 carbon atoms, a substituted or unsubstituted condensed polycyclic group with 10 to 30 carbon atoms, a substituted or unsubstituted hetrocyclic group with 5 to 30 carbon atoms or a substituted or unsubstituted alkenyl group with 4 to 40 carbon atoms.

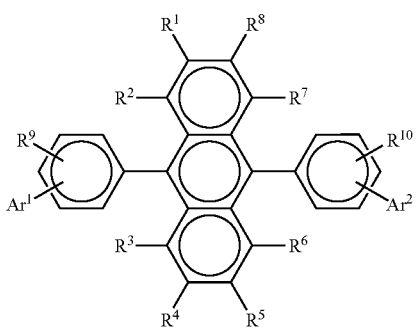

[2]

wherein $R^1$ to $R^{10}$ and $Ar^1$ and $Ar^2$ are the same as those in the formula [1].

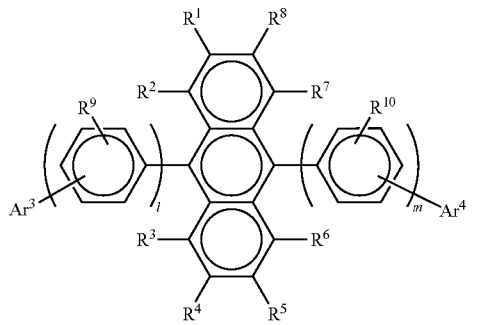

[3]

wherein $R^1$ to $R^{10}$ and $Ar^3$ and $Ar^4$ are the same as those in the formula [1], l is 1 to 3, m is 1 to 3 and l+m is 2 or more.

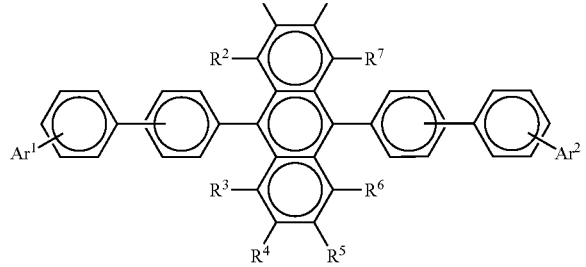

[4]

wherein $R^1$ to $R^8$ and $Ar^1$ and $Ar^2$ are the same as those in the formula [1].

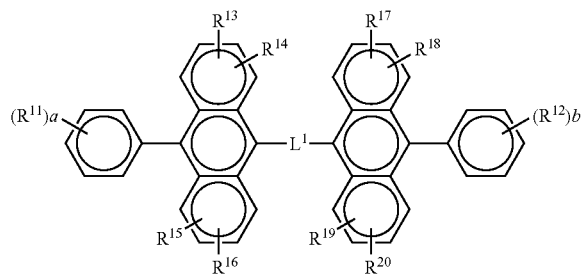

[5]

wherein $R^{11}$ to $R^{20}$ are independently a hydrogen atom, an alkenyl group, an alkyl group, a cycloalkyl group, an aryl group, an alkoxy group, an aryloxy group, an alkylamino group, an arylamino group or a substituted or unsubstituted heterocyclic group; a and b are each an integer of 1 to 5; when they are 2 or more, $R^{11}$s or $R^{12}$s may be the same or different, or $R^{11}$s or $R^{12}$s may be bonded together to form a ring; $R^{13}$ and $R^{14}$, $R^{15}$ and $R^{16}$, $R^{17}$ and $R^{18}$, or $R^{19}$ and $R^{20}$ may be bonded together to form a ring; and $L^1$ is a single bond, —O—, —S—, —N(R)— (R is an alkyl group or a substituted or unsubstituted aryl group) or an arylene group.

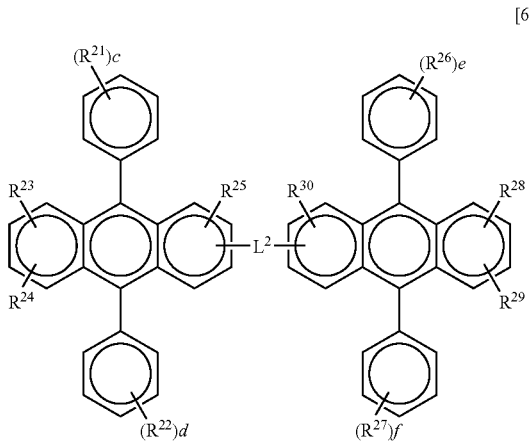

[6]

wherein R²¹ to R³⁰ are independently a hydrogen atom, an alkenyl group, an alkyl group, a cycloalkyl group, an aryl group, an alkoxy group, an aryloxy group, an alkylamino group, an arylamino group or a substituted or unsubstituted heterocyclic group; c, d, e and f are each an integer of 1 to 5; when they are 2 or more, R²¹s, R²²s, R²⁶s or R²⁷s may be the same or different, R²¹s, R²²s, R²⁶s or R²⁷s may be bonded together to form a ring, or R²³ and R²⁴, or R²⁸ and R²⁹ may be bonded together to form a ring; and L² is a single bond, —O—, —S—, —N(R)— (R is an alkyl group or a substituted or unsubstituted aryl group) or an arylene group.

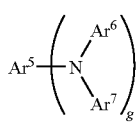

[7]

wherein Ar⁵, Ar⁶ and Ar⁷ are independently a substituted or unsubstituted monovalent aromatic group with 6 to 40 carbon atoms, at least one of them may include a styryl group and g is an integer of 1 to 4.

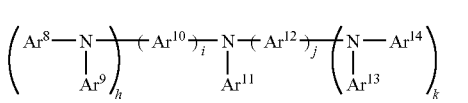

[8]

wherein Ar⁸, Ar⁹, Ar¹¹, Ar¹³ and Ar¹⁴ are independently a substituted or unsubstituted monovalent aromatic group with 6 to 40 carbon atoms, Ar¹⁰ and Ar¹² are independently a substituted or unsubstituted divalent aromatic group with 6 to 40 carbon atoms, at least one of Ar⁸ to Ar¹⁴ may include a styryl group or styrylene group, h and k are each an integer of 0 to 2 and i and j are each an integer of 0 to 3.

A blue dopant is preferably at least one selected from styrylamines, amine-substituted styryl compounds and compounds containing fused aromatic rings. A blue dopant may comprise multiple kinds of compounds. Examples of the above-mentioned styryl amines and amine-substituted styryl compounds include compounds represented by the general formulas [9] to [10] and examples of the above-mentioned compounds containing fused aromatic rings are compounds represented by the general formula [11].

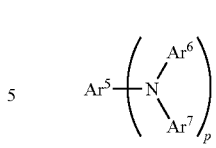

[9]

wherein Ar⁵, Ar⁶, and Ar⁷ are independently a substituted or unsubstituted aromatic group with 6 to 40 carbon atoms; at least one of them includes a styryl group and p is an integer of 1 to 3.

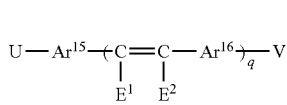

[10]

wherein Ar¹⁵ and Ar¹⁶ are independently an arylene group with 6 to 30 carbon atoms; E¹ and E² are independently an aryl or alkyl group with 6 to 30 carbon atoms, a hydrogen atom, or a cyano group; q is an integer of 1 to 3; U and/or V are a substituent including an amino group and the amino group is preferably an arylamino group.

[11]

wherein A is an alkyl group or an alkoxy group with 1 to 16 carbon atoms, a substituted or unsubstituted aryl group with 6 to 30 carbon atoms, a substituted or unsubstituted alkylamino group with 6 to 30 carbon atoms, a substituted or unsubstituted arylamino group with 6 to 30 carbon atoms and B is a fused aromatic ring group with 10 to 40 carbon atoms; and r is an integer of 1 to 4.

As a blue emitting layer, an emitting layer containing a phosphorescent compound can be used. A host material is preferably a compound containing a carbazole ring. Specific examples are shown below.

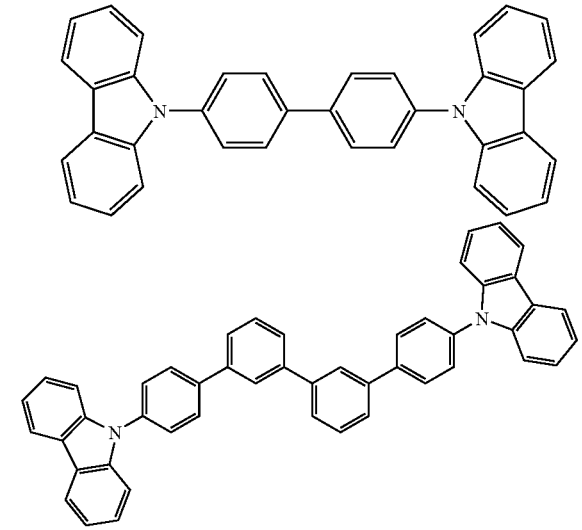

-continued

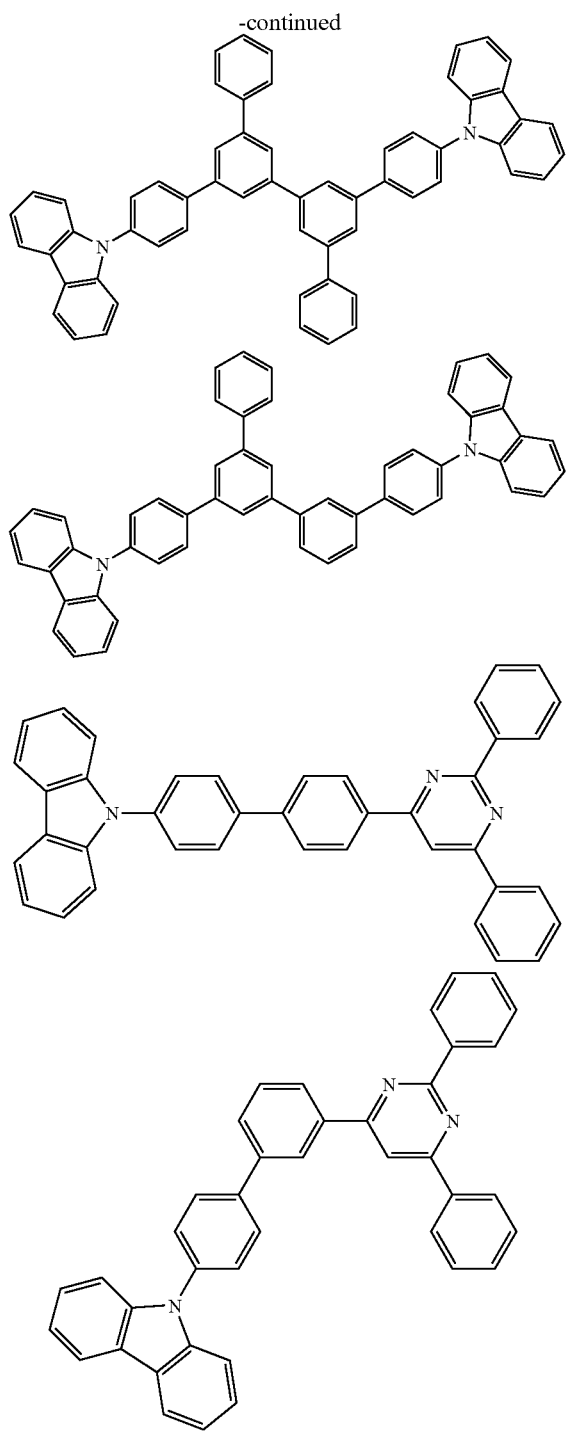

Examples of the host compounds other than the compounds shown above include triazole, oxazole, oxadiazole, imidazole, polyarylalkane, pyrazoline, pyrazolone, phenylanediamine, arylamine, amino-substituted calcone, styryl anthracene, fluorenone, hydrazone, stilbene and silazane derivatives; aromatic tertiary amine, styrylamine, aromatic dimethylidene and porphyrin compounds; anthraquinodimethane, anthrone, diphenylquinone, thiopyrandioxide, carbodiimide, fluoreniridenemethane and distyrylpyrazine derivatives; hetrocyclic tetracarboxylic anhydrides such as naphthaleneperylene; phthalocyanine derivatives; metal complexes of 8-quinolinol derivatives, various metal complex polysilane compounds represented by metal complexes having metalphthalocyanine, benzoxazole or benzothiaole as a ligand; electroconductive high molecular oligomers such as poly(N-vinylcarbazole) derivatives, aniline copolymers, thiophene oligomers and polythiophene; and polymer compounds such as polythiophene, polyphenylene, polyphenylenevinylene and polyfluorene derivatives. Host compounds can be used individually or as a combination of two or more kinds.

A phosphorescent dopant is a compound that can emit light from triplet excitons. The dopant is not limited as long as it can emit light from triplet excitons, but it is preferably a metal complex containing at least one metal selected from the group of Ir, Ru, Pd, Pt, Os and Re. Of these, a porphyrin metal complex or an ortho-metalated metal complex is preferable. As a porphyrin metal complex, a porphyrin platinum complex is preferable. There are various ligands forming an ortho-metalated metal complex. Preferable ligands include 2-phenylpyridine, 7,8-benzoquinoline, 2-(2-thienyl)pyridine, 2-(1-naphtyl)pyridine and 2-phenylquinoline derivatives. These derivatives can contain substituents if necessary. Fluorides and derivatives containing a trifluoromethyl group are particularly preferable as a blue dopant. As an auxiliary ligand, ligands other than acetylacetonate and picric acid may be contained. The phosphorescent dopants can be used individually or as a combination of two or more kinds.

The content of a phosphorescent dopant in a blue emitting layer is not limited and can be properly selected according to purposes; for example, it is 0.1 to 70 mass %, preferably 1 to 30 mass %. When the content of a phosphorescent dopant is less than 0.1 mass %, the sufficient effect by the addition thereof may be brought about. When the content exceeds 70 mass %, the device performance may be degraded due to the phenomenon called concentration quenching.

The thickness of a blue emitting layer is preferably 5 to 30 nm, more preferably 7 to 30 nm and most preferably 10 to 30 nm. When it is less than 5 nm, the formation of an emitting layer and the adjustment of chromaticity may become difficult. When it exceeds 30 nm, the driving voltage may increase.

(2) Red (Yellow-to-Orange or Yellow-to-Red) Emitting Layer

The red emitting layer is preferably an emitting layer which emits light with a maximum wavelength of 550 to 650 nm; and made of a host material and a yellow-to-orange or yellow-to-red dopant. Examples of the host material are preferably styryl derivatives, anthracene derivatives, aromatic amines, and metal complexes of 8-hydroxyquinoline or its derivatives. As examples of the styryl derivatives, anthracene derivatives and aromatic amines, host materials used for a blue emitting layer can also be used for a yellow-to-orange or yellow-to-red emitting layer. As examples of the metal complexes of 8-hydroxyquinoline or its derivatives, metal chelate oxynoide compounds including chelates of oxine (generally 8-quinolinol or 8-hydroxyquinoline), such as tris(8-quinolinol)aluminum, can be used. When a compound with a high electron-transporting property such as anthracene derivatives is used as a host material, host materials for a blue emitting layer and a yellow-to-orange or yellow-to-red emitting layer may be the same or different.

There can be used as a yellow-to-orange or a yellow-to-red dopant florescent compound containing at least one of a fluoranthene skeleton and a perylene skeleton. Examples include compounds represented by the following general formulas [12] to [28].

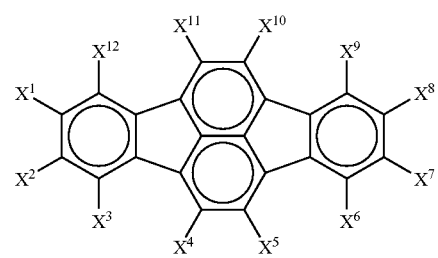
[12]
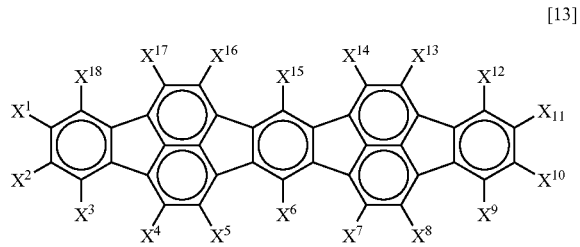
[13]
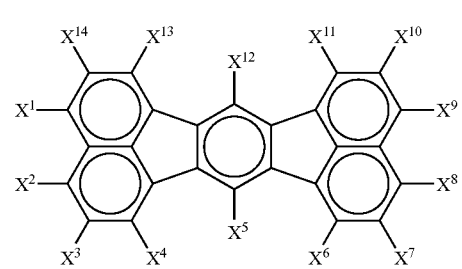
[14]
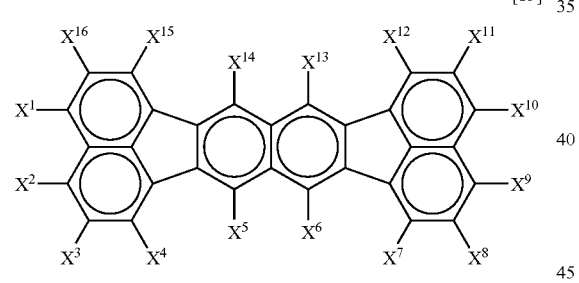
[15]
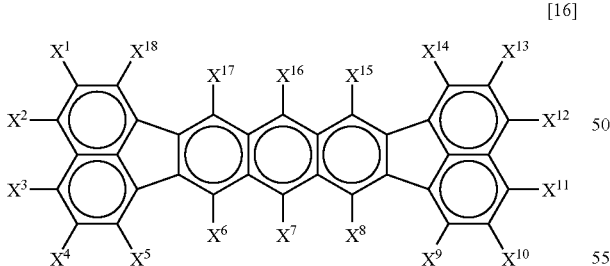
[16]
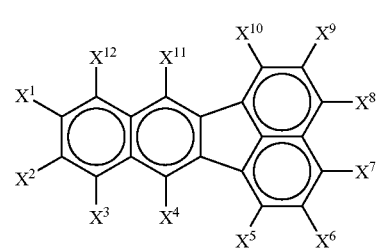
[17]
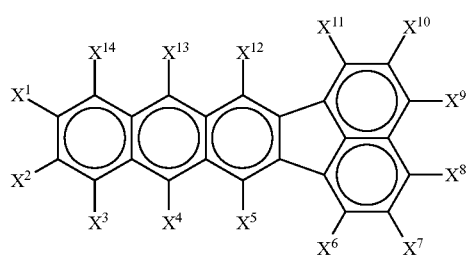
[18]
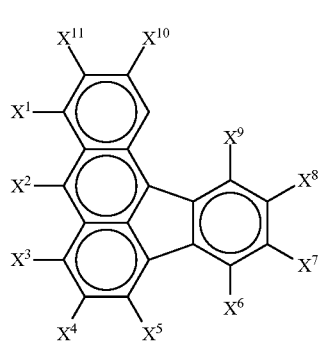
[19]
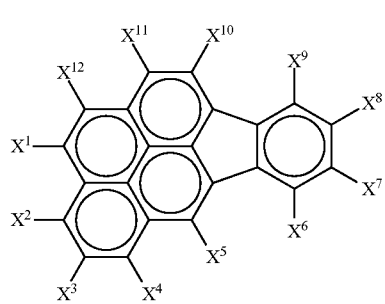
[20]
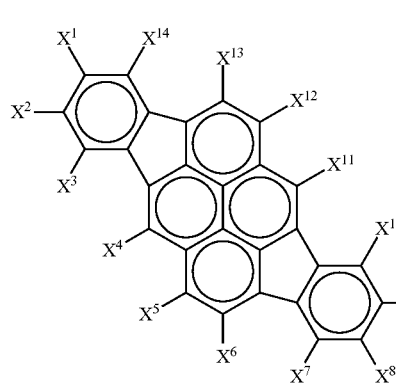
[21]
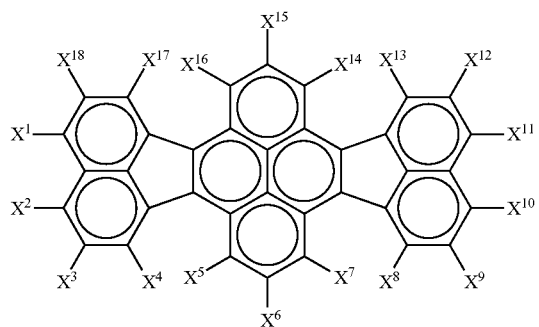
[22]

[23]

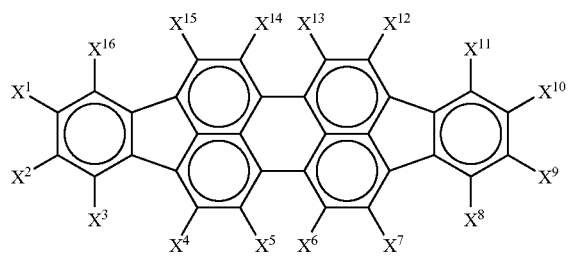

[24]

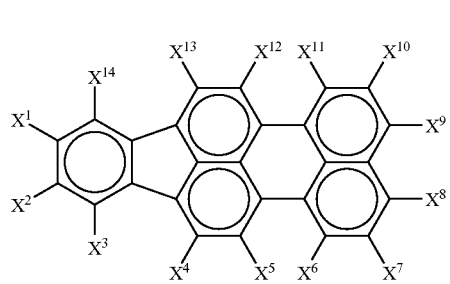

[25]

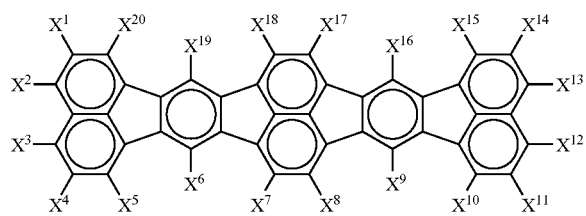

[26]

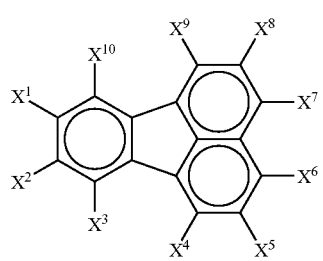

wherein $X^1$ to $X^{20}$ are independently a hydrogen atom, a linear, branched or cyclic alkyl group with 1 to 20 carbon atoms, a linear, branched or cyclic alkoxy group with 1 to 20 carbon atoms, a substituted or unsubstituted aryl group with 6 to 30 carbon atoms, a substituted or unsubstituted aryloxy group with 6 to 30 carbon atoms, a substituted or unsubstituted arylamino group with 6 to 30 carbon atoms, a substituted or unsubstituted alkylamino group with 1 to 30 carbon atoms, a substituted or unsubstituted arylalkylamino group with 7 to 30 carbon atoms or a substituted or unsubstituted alkenyl group with 8 to 30 carbon atoms; adjacent substituents and $X^1$ to $X^{20}$ may be bonded together to form a ring structure; and when adjacent substituents are an aryl group, the substituents may be the same.

The compounds represented by the general formulas [12] to [26] preferably contain an amino group or an alkenyl group.

[27]

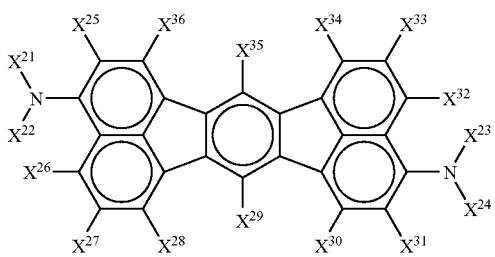

[28]

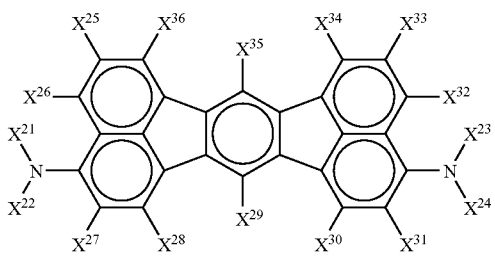

wherein $X^{21}$ to $X^{24}$ are independently an alkyl group with 1 to 20 carbon atoms, a substituted or unsubstituted aryl group with 6 to 30 carbon atoms; $X^{21}$ and $X^{22}$ and/or $X^{23}$ and $X^{24}$ may be bonded to each other with a carbon to carbon bond, —O— or —S— therebetween; $X^{25}$ to $X^{36}$ are independently a hydrogen atom, a linear, branched or cyclic alkyl group with 1 to 20 carbon atoms, a linear, branched or cyclic alkoxy group with 1 to 20 carbon atoms, a substituted or unsubstituted aryl group with 6 to 30 carbon atoms, a substituted or unsubstituted aryloxy group with 6 to 30 carbon atoms, a substituted or unsubstituted arylamino group with 6 to 30 carbon atoms, a substituted or unsubstituted alkylamino group with 1 to 30 carbon atoms, a substituted or unsubstituted arylalkylamino group with 7 to 30 carbon atoms or a substituted or unsubstituted alkenyl group with 8 to 30 carbon atoms; adjacent substituents and $X^{25}$ to $X^{36}$ may be bonded together to form a ring structure; and at least one of the substituents $X^{25}$ to $X^{36}$ in each of the formulas preferably contain an amino or alkenyl group.

A florescent compound containing a fluoranthene skeleton preferably contains an electron-donating group for high performance and long lifetime. A preferable electron-donating group is a substituted or unsubstituted arylamino group. A fluorescent compound containing a fluoranthene skeleton preferably has 5 or more fused rings, more preferably 6 or more fused rings, for the following reason. The fluorescent compound has a fluorescent peak wavelength of 540 to 700 nm. The emission from a blue emitting material and emission from the fluorescent compound overlap to give a white color. The above-mentioned fluorescent compound preferably contains a plurality of fluoranthene skeletons since the emitted light color falls in the yellow-to-orange or yellow-to-red zone. Particularly preferred fluorescent compound contains an electron-donating group and a fluoranthene or perylene skeleton and has a fluorescent peak wavelength of 540 to 700 nm.

As a red emitting layer, an emitting layer to which a phosphorescent emitting dopant is added can be used. A host material in such a case is preferably a compound containing a carbazole ring and the compounds used for a blue emitting layer can be used.

A phosphorescent dopant is a compound that can emit from triplet excitons and is not limited as long as it can emit from triplet excitons but it is preferably a metal complex containing at least one metal selected from the group of Ir, Ru, Pd, Pt, Os and Re. Of these, a porphyrin metal complex or an ortho-metalated metal complex is preferable. There are various ligands forming an ortho-metalated metal complex. Preferable ligands include 2-phenylpyridine, 7,8-benoquinoline, 2-(1-naphtyl)pyridine and 2-phenylquinoline derivatives. These derivatives can contain substituents if necessary. Preferred are 2-phenylquinoline derivatives, 2-(2-thienyl)pyridine derivatives and the like as a yellow-to-red dopant. Ligands other than the above-mentioned ligands, such as acetylacetonate and picric acid, may be contained as an auxiliary ligand.

The content of a phosphorescent dopant in a red emitting layer can be properly selected according to purposes; it is preferably 0.1 to 70 mass %, more preferably 1 to 30 mass %. When the content of a phosphorescent compound is less than 0.1 mass %, insufficient effect may be brought about. When the content exceeds 70 mass %, the phenomenon called concentration quenching may significantly proceed, thereby degrading the device performance.

The thickness of a red emitting layer is preferably 10 to 50 nm, more preferably 20 to 50 nm and most preferably 30 to 50 nm. When it is less than 10 nm, the luminous efficiency may decrease. When it exceeds 50 nm, the driving voltage may increase.

(2) Green Emitting Layer

The green emitting layer is preferably a layer which emits light with a maximum wavelength of 500 to 550 nm; and made of a host material and a green dopant. The host material are preferably styryl derivatives, anthracene derivatives, aromatic amines, and metal complexes of 8-hydroxyquinoline or its derivatives. As specific examples of the styryl derivatives, anthracene derivatives and aromatic amines, host materials used for a blue emitting layer can also be used for a green emitting layer. As specific examples of the metal complexes of 8-hydroxyquinoline or its derivatives, metal chelate oxynoide compounds including chelates of oxine (generally 8-quinolinol or 8-hydroxyquinoline), for example, tris(8-quinolinol)aluminum, can be used. When a compound with an electron-transporting property such as anthracene derivatives is used as a host material, host materials for a blue emitting layer and a green emitting layer may be the same or different. Examples of the green dopants include C545T [10-(2-benzothiazolyl)-2,3,6,7-tetrahydro-1,2,7,7-tetramethyl-1H, 5H, 11H-[1]benzopyrano[6,7,8-ij]quinolizine-11-one].

There can be used as a green dopant an emitting layer containing a phosphorescent compound. A host material in such a case is preferably a compound containing a carbazole ring and the compound used for a blue emitting layer can be used.

A phosphorescent dopant is a compound that can emit from triplet excitons and is not limited as long as it can emit from triplet excitons but it is preferably a metal complex containing at least one metal selected from the group of Ir, Ru, Pd, Pt, Os and Re. Of these, a porphyrin metal complex or an ortho-metalated metal complex is preferable. As the porphyrin metal complex, porphyrin platinum complex is preferable. There are various ligands forming an ortho-metalated metal complex. Preferable ligands include 2-phenylpyridine, 7,8-benoquinoline, 2-(2-thienyl)pyridine, 2-(1-naphtyl)pyridine and 2-phenylquinoline derivatives. These derivatives can contain substituents if necessary. Particularly preferred are 2-phenylquinoline derivatives, as a green dopant. Ligands other than the above-mentioned ligands may be contained as an auxiliary ligand. The phosphorescent dopants may be used individually or as a combination of two or more kinds.

The content of a phosphorescent dopant in a green emitting layer is not limited and can be properly selected according to purposes; but it is preferably 0.1 to 70 mass %, more preferably 1 to 30 mass %. When the content of a phosphorescent compound is less than 0.1 mass %, insufficient effect may be brought about. When the content exceeds 70 mass %, due to the phenomenon called concentration quenching the device performance may be degraded.

The thickness of a green emitting layer is preferably 10 to 50 nm, more preferably 20 to 50 nm and most preferably 30 to 50 nm. When it is less than 10 nm, the luminous efficiency may decrease. When it exceeds 50 nm, the driving voltage may increase.

2. Other Organic Layers (1) First Organic Layer

A hole-injecting layer, a hole-transporting layer, an organic semiconductor layer and the like can be arranged between the anode and the emitting layer as a first organic layer. The hole-injecting layer or the hole-transporting layer is a layer for helping the injection of holes into the emitting layer so as to transport holes to an emitting region. The hole mobility thereof is large and the ionization energy thereof is usually as small as 5.5 eV or less. A hole-injecting layer is formed to control energy level, for example, to reduce rapid energy level changes. Such a hole-injecting or hole-transporting layer is preferably made of a material which can transport holes to the emitting layer at a low electric field intensity. The hole mobility thereof is preferably at least $10^{-6}$ cm$^2$/V·second when an electric field of, e.g., $10^4$ to $10^6$ V/cm is applied. The material for forming the hole-injecting layer or the hole-transporting layer can be arbitrarily selected from materials which have been widely used as a material transporting electric charge of holes in photoconductive materials and known materials used in a hole-injecting layer of organic EL devices.

Specific examples of materials for a hole-injecting layer and a hole-transporting layer, include triazole derivatives (see U.S. Pat. No. 3,112,197 and others), oxadiazole derivatives (see U.S. Pat. No. 3,189,447 and others), imidazole derivatives (see JP-B-37-16096 and others), polyarylalkane derivatives (see U.S. Pat. Nos. 3,615,402, 3,820,989 and 3,542,544, JP-B-45-555 and 51-10983, JP-A-51-93224, 55-17105, 56-4148, 55-108667, 55-156953 and 56-36656, and others), pyrazoline derivatives and pyrazolone derivatives (see U.S. Pat. Nos. 3,180,729 and 4,278,746, JP-A-55-88064, 55-88065, 49-105537, 55-51086, 56-80051, 56-88141, 57-45545, 54-112637 and 55-74546, and others), phenylene diamine derivatives (see U.S. Pat. No. 3,615,404, JP-B-51-10105, 46-3712 and 47-25336, JP-A-54-53435, 54-110536 and 54-119925, and others), arylamine derivatives (see U.S. Pat. Nos. 3,567,450, 3,180,703, 3,240,597, 3,658,520, 4,232, 103, 4,175,961 and 4,012,376, JP-B-49-35702 and 39-27577, JP-A-55-144250, 56-119132 and 56-22437, DE1,110,518, and others), amino-substituted chalcone derivatives (see U.S. Pat. No. 3,526,501, and others), oxazole derivatives (ones disclosed in U.S. Pat. No. 3,257,203, and others), styrylanthracene derivatives (see JP-A-56-46234, and others), fluorenone derivatives (JP-A-54-110837, and others), hydrazone derivatives (see U.S. Pat. No. 3,717,462, JP-A-54-59143, 55-52063, 55-52064, 55-46760, 55-85495, 57-11350, 57-148749 and 2-311591, and others), stilbene derivatives (see JP-A-61-210363, 61-228451, 61-14642, 61-72255, 62-47646, 62-36674, 62-10652, 62-30255, 60-93455, 60-94462, 60-174749 and 60-175052, and others), silazane derivatives (U.S. Pat. No. 4,950,950), polysilanes (JP-A-2-204996), aniline copolymers (JP-A-2-282263), and electroconductive high molecular oligomers (in particular thiophene oligomers) disclosed in JP-A-1-211399.

The above-mentioned substances can be used as the material of the hole-injecting layer or the hole-transporting layer. The following can also be used: porphyrin compounds (disclosed in JP-A-63-2956965 and others), aromatic tertiary amine compounds and styrylamine compounds (see U.S. Pat. No. 4,127,412, JP-A-53-27033, 54-58445, 54-149634, 54-64299, 55-79450, 55-144250, 56-119132, 61-295558, 61-98353 and 63-295695, and others), and aromatic tertiary amine compounds. The following can also be given as examples: 4,4'-bis(N-(1-naphthyl)-N-phenylamino)biphenyl, which has in the molecule thereof two condensed aromatic rings, disclosed in U.S. Pat. No. 5,061,569, and 4,4', 4"-tris(N-(3-methylphenyl)-N-phenylamino) triphenylamine, wherein three triphenylamine units are linked to each other in a star-burst form, disclosed in JP-A-4-308688. Inorganic compounds such as aromatic dimethylidene type compounds, mentioned above as the material for an emitting layer, and p-type Si and p-type SiC can also be used as the material of the hole-injecting layer or the hole-transporting layer.

This hole-injecting layer or the hole-transporting layer may be a single layer made of one or more of the above-mentioned materials. Hole-injecting layers or the hole-transporting layers made of compounds different from each other may be stacked. The thickness of the hole-injecting layer or the hole-transporting layer is not particularly limited, and is preferably 20 to 200 nm.

The organic semiconductor layer is a layer for helping the injection of holes or electrons into the emitting layer, and is preferably a layer having an electroconductivity of $10^{-10}$ S/cm or more. The material of such an organic semiconductor layer may be an electroconductive oligomer, such as thiophene-containing oligomers or arylamine-containing oligomers disclosed in JP-A-8-193191, electroconductive dendrimers such as arylamine-containing dendrimers. The thickness of the organic semiconductor layer is not particularly limited, and is preferably 10 to 1,000 nm.

(2) Second Organic Layer

An electron-injecting layer, an electron-transporting layer and the like can be arranged between a cathode and an emitting layer as a second organic layer. The electron-injecting layer or the electron-transporting layer is a layer for helping the injection of electrons into the emitting layer, and has a large electron mobility. The electron-injecting layer is formed to control energy level, for example, to reduce rapid energy level changes.

The thickness of electron-transporting layer is properly selected several nm to several μm but preferably selected such that the electron mobility is $10^{-5}$ cm$^2$/Vs or more when applied with an electric field of $10^4$ to $10^6$ V/cm.

The material used for the electron-injecting layer is preferably a metal complex of 8-hydroxyquinoline or a derivative thereof.

Specific examples of the metal complex of 8-hydroxyquinoline or a derivative thereof include metal chelate oxynoid compounds containing a chelate of oxine (generally, 8-quinolinol or 8-hydroxyquinoline).

For example, Alq described in the explanation of the emitting material can be used for the electron-injecting layer.

Examples of the oxadiazole derivatives include electron-transporting compounds represented by the following general formulas:

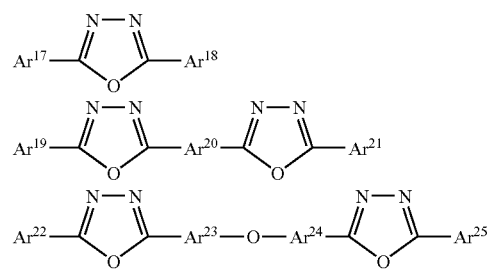

wherein $Ar^{17}$, $Ar^{18}$, $Ar^{19}$, $Ar^{21}$, $Ar^{22}$ and $Ar^{25}$ may be the same or different and each represent a substituted or unsubstituted aryl group; and $Ar^{20}$, $Ar^{23}$ and $Ar^{24}$ may be the same or different and each represent a substituted or unsubstituted arylene group.

Examples of the aryl group include phenyl, biphenyl, anthranyl, perylenyl, and pyrenyl groups. Examples of the arylene group include phenylene, naphthylene, biphenylene, anthranylene, perylenylene, and pyrenylene groups. Examples of the substituents include alkyl groups with 1 to 10 carbon atoms, alkoxy groups with 1 to 10 carbon atoms, and a cyano group. The electron-transporting compounds are preferably ones from which a thin film can be easily formed.

Specific examples of the electron-transporting compounds are mentioned below.

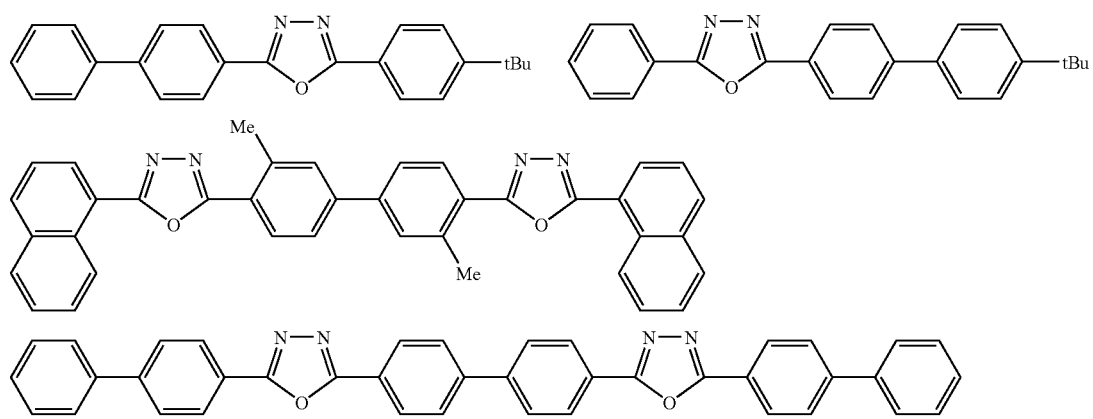

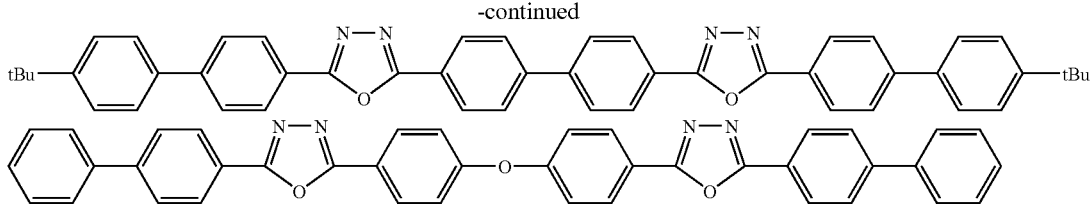

In the formulas, tBu represents a tert-butyl group and Me represents a methyl group.

Nitrogen-containing heterocyclic compounds represented by the following formulas

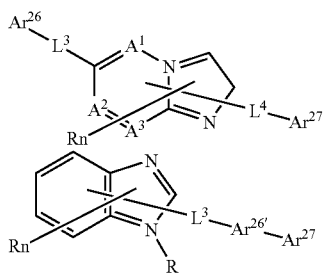

wherein $A^1$ to $A^3$ is a nitrogen atom or carbon atom;

R is a substituted or unsubstituted aryl group with 6 to 60 carbon atoms, a substituted or unsubstituted heteroaryl group with 3 to 60 carbon atoms, an alkyl group with 1 to 20 carbon atoms, a haloalkyl group with 1 to 20 carbon atoms, or an alkoxy group with 1 to 20 carbon atoms; n is an integer of 0 to 5 and when n is an integer of 2 or more, Rs may be the same or different or adjacent Rs may be bonded to each other to form a substituted or unsubstituted carbocyclic aliphatic ring or a substituted or unsubstituted carbocyclic aromatic ring;

$Ar^{26}$ is a substituted or unsubstituted aryl group with 6 to 60 carbon atoms, or a substituted or unsubstituted heteroaryl group with 3 to 60 carbon atoms;

$Ar^{27}$ is a hydrogen atom, an alkyl group with 1 to 20 carbon atoms, a haloalkyl group with 1 to 20 carbon atoms, an alkoxy group with 1 to 20 carbon atoms, a substituted or unsubstituted aryl group with 6 to 60 carbon atoms, or a substituted or unsubstituted heteroaryl group with 3 to 60 carbon atoms;

$Ar^{26'}$ is a substituted or unsubstituted arylene group with 6 to 60 carbon atoms, or a substituted or unsubstituted heteroarylene group with 3 to 60 carbon atoms;

provided that either one of $Ar^{26}$, $Ar^{27}$ and $Ar^{26'}$ is a substituted or unsubstituted condensed cyclic group with 10 to 60 carbon atoms or a substituted or unsubstituted condensed heterocyclic group with 3 to 60 carbon atoms;

$L^3$ and $L^4$ are each a single bond, a substituted or unsubstituted condensed cyclic group with 6 to 60 carbon atoms, a substituted or unsubstituted condensed heterocyclic group with 3 to 60 carbon atoms, or a substituted or unsubstituted fluorenylene group.

Nitrogen-containing heterocyclic compounds represented by the following formula:

wherein HAr is a substituted or unsubstituted nitrogen-containing heterocyclic ring with 3 to 40 carbon atoms;

$L^5$ is a single bond, a substituted or unsubstituted arylene group with 6 to 60 carbon atoms, a substituted or unsubstituted heteroarylene group with 3 to 60 carbon atoms, or a substituted or unsubstituted fluorenylene group;

$Ar^{28}$ is a substituted or unsubstituted bivalent aromatic hydrocarbon group with 6 to 60 carbon atoms;

$Ar^{29}$ is a substituted or unsubstituted aryl group with 6 to 60 carbon atoms or a substituted or unsubstituted heteroaryl group with 3 to 60 carbon atoms.

An EL device using a silacyclopentadiene derivative represented by the following formula, disclosed in JP-A-09-087616:

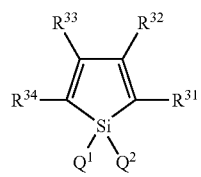

wherein $Q^1$ and $Q^2$ are each a saturated or unsaturated hydrocarbon group with 1 to 6 carbon atoms, an alkoxy group, an alkenyloxy group, an alkynyloxy group, a hydroxyl group, a substituted or unsubstituted aryl group, or a substituted or unsubstituted heterocyclic group, or $Q^1$ or $Q^2$ are bonded to each other to form a saturated or unsaturated ring; $R^{31}$ to $R^{34}$ are each a hydrogen atom, a halogen atom, a substituted or unsubstituted alkyl group with 1 to 6 carbon atoms, an alkoxy group, an aryloxy group, a perfluoroalkyl group, a perfluoroalkoxy group, an amino group, an alkylcarbonyl group, an arylcarbonyl group, an alkoxycarbonyl group, an aryloxycarbonyl group, an azo group, an alkylcarbonyloxy group, an arylcarbonyloxy group, an alkoxycarbonyloxy group, an aryloxycarbonyloxy group, a sulfinyl group, a sulfonyl group, a sulfanyl group, a silyl group, a carbamoil group, an aryl group, a heterocyclic group, an alkenyl group, an alkynyl group, a nitro group, a formyl group, a nitroso group, a formyloxy group, an isocyano group, a cyanate group, an isocyanate group, a thiocyanate group, an isothiocyanate group or a cyano group, or adjacent $R^{31}$ to $R^{34}$ may form a substituted or unsubstituted condensed ring structure.

Silacyclopentadiene derivatives represented by the following formula, disclosed in JP-A-09-194487:

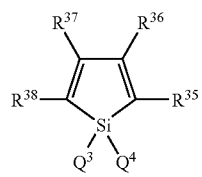

wherein $Q^3$ and $Q^4$ are each a saturated or unsaturated hydrocarbon group with 1 to 6 carbon atoms, an alkoxy group, an alkenyloxy group, an alkynyloxy group, a substituted or unsubstituted aryl group, or a substituted or unsubstituted heterocyclic group, or $Q^3$ or $Q^4$ are bonded to each other to form a saturated or unsaturated ring; $R^{35}$ to $R^{38}$ are each a hydrogen atom, a halogen atom, a substituted or unsubstituted alkyl group with 1 to 6 carbon atoms, an alkoxy group, an aryloxy group, a perfluoroalkyl group, a perfluoroalkoxy group, an amino group, an alkylcarbonyl group, an arylcarbonyl group, an alkoxycarbonyl group, an aryloxycarbonyl group, an azo group, an alkylcarbonyloxy group, an arylcarbonyloxy group, an alkoxycarbonyloxy group, an aryloxycarbonyloxy group, a sulfinyl group, a sulfonyl group, a sulfanyl group, a silyl group, a carbamoil group, an aryl group, a heterocyclic group, an alkenyl group, an alkynyl group, a nitro group, a formyl group, a nitroso group, a formyloxy group, an isocyano group, a cyanate group, an isocyanate group, a thiocyanate group, an isothiocyanate group or a cyano group, or adjacent $R^{35}$ to $R^{38}$ may bond to form a structure wherein substituted or unsubstituted rings are condensed to each other;

provided that in the case where $R^{35}$ and $R^{38}$ are phenyl groups, $Q^3$ and $Q^4$ are neither alkyl groups nor phenyl groups; in the case where $R^{35}$ and $R^{38}$ are thienyl groups, $Q^3$, $Q^4$, $R^{36}$ and $R^{37}$ do not form the structure satisfying the conditions at the same time that where $Q^3$ and $Q^4$ are monovalent hydrocarbon groups, and $R^{36}$ and $R^{37}$ are each an alkyl group, an aryl group, an alkenyl, or an aliphatic ring group formed by $R^{36}$ and $R^{37}$ bonded to each other; in the case where $R^{35}$ and $R^{38}$ are silyl groups, $R^{36}$, $R^{37}$, $Q^3$ and $Q^4$ are each neither a monovalent hydrocarbon group with 1 to 6 carbon atoms nor a hydrogen atom; and in the case where $R^{35}$ and $R^{36}$ form a condensed structure with benzene rings, $Q^3$ and $Q^4$ are neither an alkyl group nor a phenyl group.

Borane derivatives represented by the following formula, disclosed in JP-A1-2000-040586:

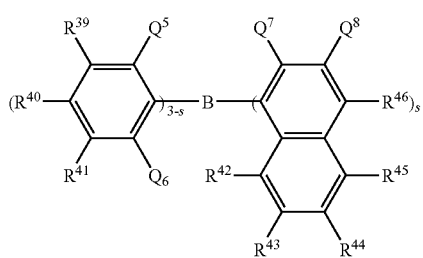

wherein $R^{39}$ to $R^{46}$ and $Q^8$ are each a hydrogen atom, a saturated or unsaturated hydrocarbon group, an aromatic group, a heterocyclic group, a substituted amino group, a substituted boryl group, an alkoxy group or an aryloxy group; $Q^5$, $Q^6$ and $Q^7$ are each a saturated or unsaturated hydrocarbon group, an aromatic group, a heterocyclic group, a substituted amino group, an alkoxy group or an aryloxy group; the substituents of $Q^7$ and $Q^8$ may be bonded to each other to form a condensed ring; s is an integer of 1 to 3, and $Q^7$s may be different from each other when s is 2 or more; provided that excluded are the compounds where s is 1, $Q^5$, $Q^6$ and $R^{40}$ are methyl groups and $R^{46}$ is a hydrogen atom or substituted boryl group, and the compounds where s is 3 and $Q^7$ is a methyl group.

Compounds represented by the following formula, disclosed in JP-A-10-088121:

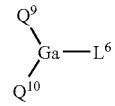

wherein $Q^9$ and $Q''$ are independently a ligand represented by the following formula (3); and $L^6$ is a ligand represented by a halogen atom, a substituted or unsubstituted alkyl group, a substituted or unsubstituted cycloalkyl group, a substituted or unsubstituted aryl group, a substituted or unsubstituted heterocyclic group, —OR$^{47}$ (R$^{47}$ is a hydrogen atom, a substituted or unsubstituted alkyl group, a substituted or unsubstituted cycloalkyl group, a substituted or unsubstituted aryl group, a substituted or unsubstituted heterocyclic group), or —O—Ga-Q$^{11}$ (Q$^{12}$) (Q$^{11}$ and Q$^{12}$ represent the same meanings as Q$^9$ and Q$^{10}$.

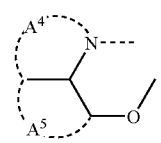

(3)

wherein rings $A^4$ and $A^5$ are each a substituted or unsubstituted 6-membered aryl rings which are condensed to each other.

The metal complexes have the strong nature of an n-type semiconductor and large ability of injecting electrons. Further the energy generated at the time of forming such a complex is small and therefore strong bonding can be obtained between a metal and ligands in the complex formed, and a fluorescent quantum efficiency is large.

Specific examples of the rings $A^4$ and $A^5$ which form the ligands of the above formula include halogen atoms such as chlorine, bromine, iodine and fluorine; substituted or unsubstituted alkyl groups such as methyl, ethyl, propyl, butyl, sec-butyl, tert-butyl, pentyl, hexyl, heptyl, octyl, stearyl and trichloromethyl; substituted or unsubstituted aryl groups such as phenyl, naphthyl, 3-methylphenyl, 3-methoxyphenyl, 3-fluorophenyl, 3-trichloromethylphenyl, 3-trifluoromethylphenyl and 3-nitrophenyl; substituted or unsubstituted alkoxy groups such as methoxy, n-butoxy, tert-butoxy, trichloromethoxy, trifluoroethoxy, pentafluoropropoxy, 2,2,3,3-tetrafluoropropoxy, 1,1,1,3,3,3-hexafluoro-2-propoxy and 6-(perfluoroethyl)hexyloxy; substituted or unsubstituted aryloxy groups such as phenoxy, p-nitrophenoxy, p-tert-butylphenoxy, 3-fluorophenoxy, pentafluorophenoxy and 3-trifluoromethylphenoxy; substituted or unsubstituted alkylthio groups such as methylhio, ethylthio, tert-butylthio, hexylthio, octylthio and trifruoromethyltio; substituted or unsubstituted arylthio groups such as phenylthio, p-nitrophenylthio, p-tert-butylphenylthio, 3-fluorophenylthio, pentafluorophenylthio and 3-trifluoromethylphenylthio; a cyano group; a nitro group, an amino group; mono or di-substituted amino groups such as methylamino, dimethylamino, ethylamino, diethylamino, dipropylamino, dibutylamino and diphenylamino; acylamino groups such as bis(acetoxymethyl)amino, bis(acetoxyethyl)amino, bis(acetoxypropyl)amino and bis(acetoxybutyl)amino; a hydroxy group; a siloxy group; an acyl group; a carbamoyl group; substituted carbamoyl groups such as methylcarbamoyl, dimethylcarbamoyl, ethylcarbamoyl, diethylcarbamoyl, propylcarbamoyl, butylcarbamoyl and phenylcarbamoyl; a carboxylic group; a sulfonic acid group; an imido group; cycloalkyl groups such as cyclopentyl and cyclohexyl; aryl groups such as phenyl, naphthyl, biphenyl, anthranyl, phenanthryl, fluorenyl and pyrenyl; and heterocyclic groups such as pyridinyl, pyrazinyl, pyrimidinyl, pryidazinyl, triazinyl, indolinyl, quinolinyl, acridinyl, pyrrolidinyl, dioxanyl, piperidinyl, morpholidinyl, piperazinyl, triathinyl, carbazolyl, furanyl, thiophenyl, oxazolyl, oxadiazolyl, benzooxazolyl, thiazolyl, thiadiazolyl, benzothiazolyl, triazolyl, imidazolyl, benzoimidazolyl and puranyl. Moreover the above-mentioned substituents may be bonded to each other to form a six-membered aryl or heterocyclic ring.

A reducing dopant may be contained in the electron-transporting region or in an interfacial region between the cathode and the organic layer. The reducing dopant is defined as a substance which can reduce an electron-transporting compound. Accordingly, various substances which have given reducing properties can be used. For example, at least one substance can be preferably used which is selected from the group consisting of alkali metals, alkaline earth metals, rare earth metals, alkali metal oxides, alkali metal halides, alkaline earth metal oxides, alkaline earth metal halides, rare earth metal oxides, rare earth metal halides, alkali metal organic complexes, alkaline earth metal organic complexes, and rare earth metal organic complexes.

Specific examples of preferred reducing dopants include at least one alkali metal selected from the group consisting of Na (work function: 2.36 eV), K (work function: 2.28 eV), Rb (work function: 2.16 eV) and Cs (work function: 1.95 eV) or at least one alkaline earth metal selected from the group consisting of Ca (work function: 2.9 eV), Sr (work function: 2.0 to 2.5 eV) and Ba (work function: 2.52 eV). Particularly preferred are ones having a work function of 2.9 eV or less. Among these, a more preferable reducing dopant is at least one alkali metal selected from the group consisting of K, Rb and Cs, even more preferably Rb and Cs and the most preferably Cs. These alkali metals have a particularly high reducing ability, and therefore adding a relatively small amount thereof into an electron-injecting region enhances the luminance and lifetime of the organic EL device. As a reducing dopant having a work function of 2.9 eV or less, combinations of two or more of these alkali metals are preferable. Combinations with Cs, for example, Cs and Na, Cs and K, Cs and Rb or Cs, Na and K are particularly preferable. The combination with Cs efficiently exhibits a reducing ability and the addition thereof into an electron-injecting region enhances the luminance and the lifetime of the organic EL device.

In the invention, an electron-injecting layer which is formed of an insulator or a semiconductor may further be provided between a cathode and an organic layer. By providing the layers, current leakage can be effectively prevented to improve the injection of electrons. As the insulator, at least one metal compound selected from the group consisting of alkali metal calcogenides, alkaline earth metal calcogenides, halides of alkali metals and halides of alkaline earth metals can be preferably used. When the electron-injecting layer is formed of the alkali metal calcogenide or the like, the injection of electrons can be further improved, it being preferably. Specifically preferable alkali metal calcogenides include $Li_2O$, LiO, $Na_2S$, $Na_2Se$ and NaO and preferable alkaline earth metal calcogenides include CaO, BaO, SrO, BeO, BaS and CaSe. Preferable halides of alkali metals include LiF, NaF, KF, LiCl, KCl and NaCl. Preferable halides of alkaline earth metals include fluorides such as $CaF_2$, $BaF_2$, $SrF_2$, $MgF_2$ and $BeF_2$ and halides other than fluorides.

Examples of the semiconductor for forming an electron-transporting layer include oxides, nitrides or oxynitrides containing at least one element selected from Ba, Ca, Sr, Yb, Al, Ga, In, Li, Na, Cd, Mg, Si, Ta, Sb and Zn, and combinations of two or more thereof. The inorganic compound for an electron-transporting layer is preferably a microcrystalline or amorphous insulating thin film. When an electron-transporting layer is formed of the insulating thin film, a more uniform thin film can be formed to reduce pixel defects such as dark spots. Examples of such an inorganic compound include the above-mentioned alkali metal calcogenides, alkaline earth metal calcogenides, halides of alkali metals, and halides of alkaline earth metals.

The thickness of electron-injecting or electron-transporting layer is not particularly limited but preferably 1 to 100 nm.

The first emitting layer or first organic layer which is the organic layer nearest the anode preferably contains an oxidant. Preferable oxidants contained in the first emitting layer or first organic layer are electron attractors or electron acceptors. Examples thereof include salts of Lewis acids with various quinone derivatives, dicyanoquinodimethane derivatives and aromatic amines. Particularly preferred Lewis acids include iron chloride, antimony chloride and aluminum chloride.

The emitting layer of an organic layer nearest the anode or the second organic layer preferably contains a reducing agent. Preferable reducing agents are alkali metals, alkaline earth metals, oxides of alkali metals, oxides of alkaline earth metals, oxides of rare earth metals, halides of alkali metals, halides of alkaline earth metals, halides of rare earth metals, and complexes formed of alkali metals and aromatic compounds. Particularly preferred alkali metals are Cs, Li, Na and K.

4. Inorganic Compound Layer

There may be provided an inorganic compound layer(s) in contact with an anode and/or a cathode. The inorganic compound layer functions as an adhesion improving layer. Preferable inorganic compounds used for the inorganic compound layer include alkali metal oxides, alkaline earth metal oxides, rare earth metal oxides, alkali metal halides, alkaline earth metal halides, rare earth metal halides, and various oxides, nitrides and nitric oxides such as $SiO_x$, $AlO_x$, $SiN_x$, SiON, AlON, $GeO_x$, $LiO_x$, LiON, $TiO_x$, TiON, $TaO_x$, TaON, $TaN_x$ and C. As a component of the layer in contact with the anode, $SiO_x$, $AlO_x$, $Sin_x$, SiON, AlON, $GeO_x$ and C are preferable, since they can form a stable injecting interface layer. As a component of the layer in contact with the cathode, LiF, $MgF_2$, $CaF_2$, $MgF_2$ and NaF are preferable. The thickness of the inorganic compound layer is not particularly limited, and is preferably 0.1 nm to 100 nm.

Methods of forming respective organic layers including an emitting layer and inorganic compound layers are not particularly limited. For example, known methods such as deposition, spin coating, casting, and LB technique can be applied. The electron-injecting layer and the emitting layer are preferably formed by the same method, because this makes the properties of the organic EL devices obtained constant and the production time can be shortened. For example, when the electron-injecting layer is formed by deposition, the emitting layer is preferably formed by deposition, too.

5. Electrodes

For the anode, the following is preferably used: metals, alloys or electric conductive compounds, or mixtures thereof that have a large work function (e.g., 4 eV or more). Specific examples include indium tin oxide (ITO), indium zinc oxide, tin, zinc oxide, gold, platinum, and palladium. They can be used individually or as a combination of 2 or more kinds.

The thickness of the anode is not particularly limited, but is preferably 10 to 1,000 nm, more preferably 10 to 200 nm.

For the cathode, the following is preferably used: metals, alloys or electric conductive compounds, or a mixture thereof that have a small work function (e.g., less than 4 eV). Specific examples include magnesium, aluminum, indium, lithium, sodium, and silver. They can be used individually or as a combination of 2 or more kinds. The thickness of the cathode is not also particularly limited, but is preferably 10 to 1,000 nm, more preferably 10 to 200 nm. It is preferred that at least one of the anode and the cathode be substantially transparent, more specifically, have a light transmission of 10% or more, in order to effectively take out light emitted from an emitting layer to the outside. The electrodes can be formed by vacuum deposition, sputtering, ion plating, electron beam deposition, CVD, MOCVD, plasma CVD and so on.

EXAMPLES

Examples of the invention will be explained below, but the invention shall not be limited to these Examples. Organic EL devices obtained in Examples were evaluated as follows.

(1) Initial chromaticity: A chromaticity was measured in CIE1931 chromaticity coordinates with CS1000 supplied by MINOLTA Co., Ltd. Luminous efficiency was calculated and evaluated.

(2) Luminous efficiency: Calculated from a luminance measured with CS1000 supplied by MINOLTA Co., Ltd. and a current density in the measurement.

(3) Chromaticity difference between before and after driving: A device was driven at a constant current for a constant period of time at room temperature, and a chromaticity after the driving was measured in the same manner as in the measurement of an initial chromaticity. Chromaticity difference=chromaticity after driving−initial chromaticity. An initial luminance in the driving test was set at 1,000 cd/m$^2$.

(4) Ionization potential ("IP" hereinafter): Measured in atmosphere with a photoelectron spectrometer (AC-1, supplied by Riken Keiki Co., Ltd.). Photoelectrons released were plotted at ½ fractional power relative to the energy of ultraviolet ray with which a material (powder) was irradiated, and the threshold value of photoelectron release energy was taken as IP.

(5) Affinity level ("Af" hereinafter): Af=Ip−Eg. Eg represents an optical band gap calculated from a long wavelength side tangent line when a solution of a material (solvent: toluene) was measured for ultraviolet-visible light absorption spectra with an ultraviolet-visible light spectrophotometer (UV-3100PC, supplied by Shimadzu Corporation).

(6) Hole or electron mobility: Measured with TOF-301 supplied by Optel CO. according to a "Time of Flight" method.

Example 1

Formation of Organic EL Device

A 25 mm×75 mm and 1.1 mm thick glass substrate with an ITO transparent electrode (anode) (supplied by GEOMATEC CO., LTD.) was subjected to ultrasonic cleaning in isopropyl alcohol for 5 minutes and then subjected to UV ozone cleaning for 30 minutes. The cleaned glass substrate with transparent electrode lines was fitted to a substrate holder of a vacuum vapor deposition apparatus. First, a 60 nm thick film of N,N'-bis(N,N'-diphenyl-4-aminophenyl)-N,N-diphenyl-4,4'-diamino-1,1'-biphenyl (to be abbreviated as "TPD232 film" hereinafter) was formed on the surface thereof on which the transparent electrode lines were formed so as to cover the above transparent electrode. The TPD 232 film worked as a hole injecting layer. The formation of the TPD232 film was followed by formation of 20 nm thick film of 4,4'-bis[N-(1-naphthyl)-N-phenylamino]biphenyl (to be abbreviated as "NPD film" hereinafter) on the TPD232 film. The NPD film worked as a hole transporting layer.

Figure 5:
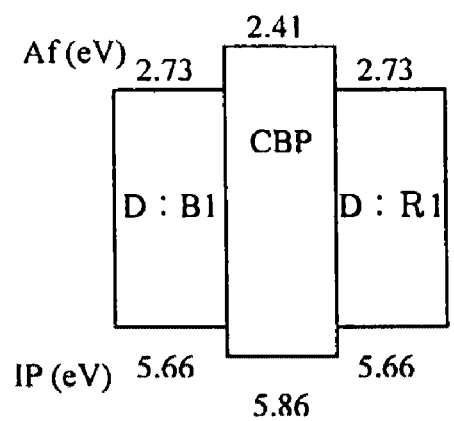
FIG. 5(a) is an energy level diagram in Example 1.
FIG. 5(b) is an energy level diagram in Comparative Example 2.
FIG. 5(c) is an energy level diagram in Comparative Example 3.
FIG. 5(d) is an energy level diagram in Comparative Example 4.
Figure 5:
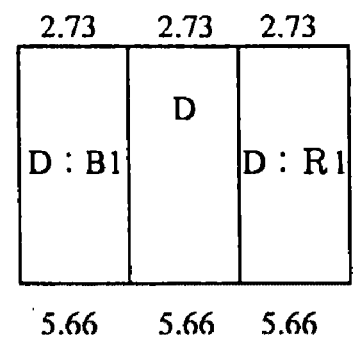
Figure 5:
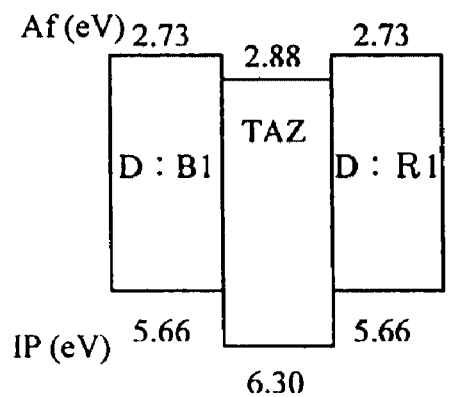
Figure 5:
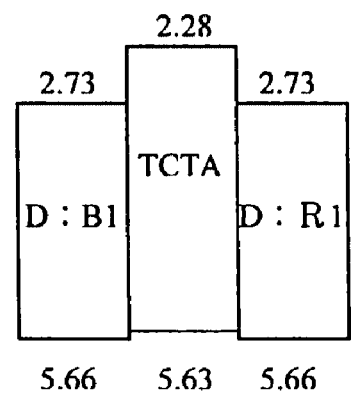

Further, the formation of the NPD film was followed by formation of a 10 nm thick film, which was formed by vapor deposition of a styryl derivative DPVDPAN of the formula [32] and B1 of the formula [33] at a weight ratio of 40:1, to obtain a first emitting layer (IP/Af (eV)=5.66/2.73). This first emitting layer emits light in blue. Then, a 5 nm thick film of 4,4-N,N-dicarbazolebiphenyl of the formula [34] (to be abbreviated as "CBP film" hereinafter) was formed. This CBP film worked as an electron barrier layer (IP/Af [eV]= 5.86/2.41). Then, a 30 nm thick film was formed by vapor deposition of a styryl derivative DPVDPAN and R1 of the formula [35] (fluorescence peak wavelength 545 nm) at a weight ratio of 40:1, to obtain a yellow to red emitting layer (Af=2.73). As an electron-transporting layer, a 10 nm thick film of tris(8-quinolinol)aluminum (to be abbreviated as "Alq film" hereinafter) was formed on the above film. Then, Li (Li source: supplied by Saes getter Co., Ltd.) and Alq were vapor co-deposited to form a 10 nm thick Alq:Li film as an electron-injecting layer. Then, a metal cathode was formed on this Alq:Li film by vapor deposition of metal Al to a thickness of 150 nm, to form an organic EL device. FIG. 5(a) is an energy level diagram of the electron barrier layer and layers on both sides thereof in Example 1.

[32]

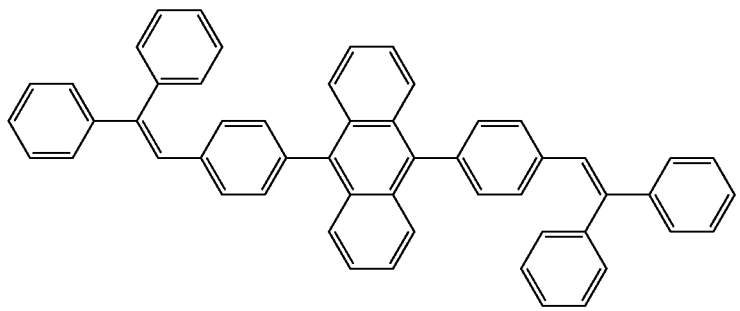

DPVDPAN

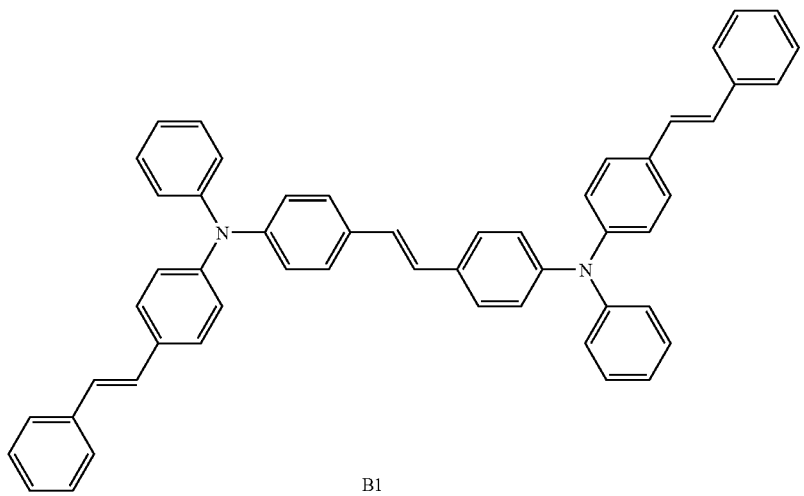

B1

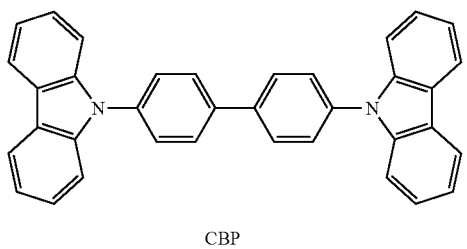

CBP

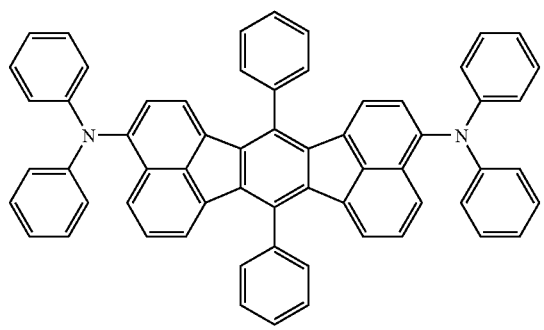

R1

(Evaluation of Organic EL Device)

It was found that the above device had an emission luminance of 100 cd/m² at a DC voltage of 6.5 V and an efficiency of 14 cd/A. Light from the device made of the materials has CIE1931 chromaticity coordinates of (x,y)=(0.281, 0.281) and was white. When the above device was driven at a constant current at an initial luminance of 1,000 cd/m², the lifetime thereof was excellent 10,000 hours. The chromaticity thereof after 10,000 hours' driving was (0.291, 0.290), and the chromaticity difference between before and after the 10,000 hours' driving was (0.010, 0.009), so that the device was found to be excellent. Table 1 shows measurement results of initial performances, lifetime and heat resistance of organic EL devices obtained in Example 1 and the following Examples 2 to 7 and Comparative Examples 1 to 5. As is clear from this Table, the organic EL device of this Example had high luminous efficiency and small change in color as compared with conventional devices.

Example 2

A device was fabricated in the same manner as in Example 1 except for the following. A 5 nm thick CzTT film represented by [36] was formed on a first emitting layer to obtain an electron barrier layer (IP/Af (eV)=5.90/2.41). This device had an emission luminance of 103 cd/m² at a DC voltage of 6.5 V and an efficiency of 13 cd/A. The chromaticity was (0.293, 0.282), and white emission was obtained. The chromaticity difference between before and after 10,000 hours' driving was (0.012, 0.011), and it was found that the device had high efficiency and small change in chromaticity.

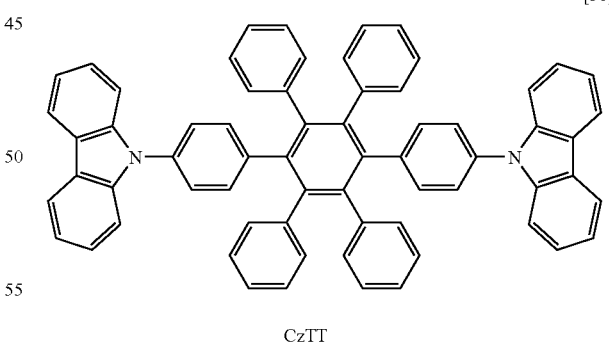

CzTT

Example 3

A device was fabricated in the same manner as in Example 1 except for the following. A 2.5 nm thick BCP film represented by [37] was formed on a first emitting layer, followed by formation of a 2.5 nm thick NPD film represented by [38] to obtain an electron barrier layer formed of a plurality of layers (IP of BCP/Af of NPD (eV)=5.93/2.20). This device had an emission luminance of 99 cd/m² at a DC voltage of 6.5 V and an efficiency of 16 cd/A. The chromaticity was (0.295, 0.281), and white emission was obtained. The chromaticity difference between before and after 10,000 hours' driving was (0.0082, 0.007), and it was found that the device had high efficiency and small change in chromaticity.

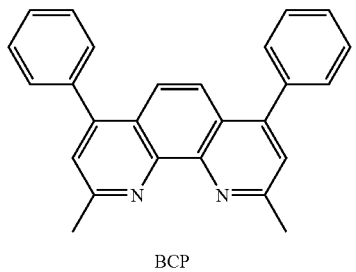

BCP

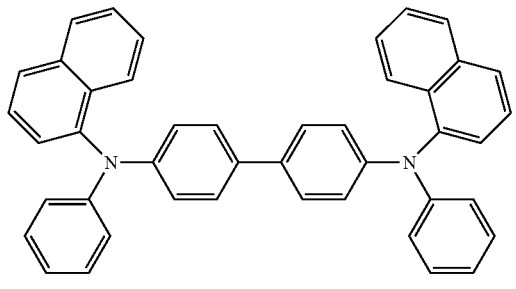

NPD

Comparative Example 1

Case where the Affinity Level of an Electron Barrier Layer is Lower than that of an Emitting Layer by 0.08 eV A device was fabricated in the same manner as in Example 1 except for the following. A 2.5 nm thick Alq film represented by [39] was formed on a first emitting layer, followed by formation of a 2.5 nm thick Czl film represented by [40] to obtain an electron barrier layer formed of a plurality of layers (IP of Alq/Af of Czl (eV)=5.70/2.65). This device had an emission luminance of 101 cd/m² at a DC voltage of 6.5 V and an efficiency of 8 cd/A, which was not satisfactory. The chromaticity was (0.286, 0.283), and white emission was obtained. However, the chromaticity difference between before and after 10,000 hours' driving was large as compared with those in Examples 1 to 3.

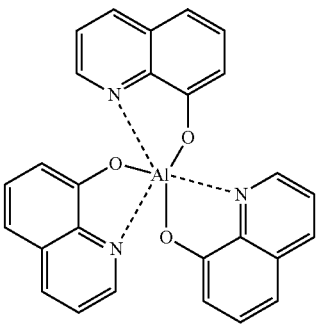

Alq

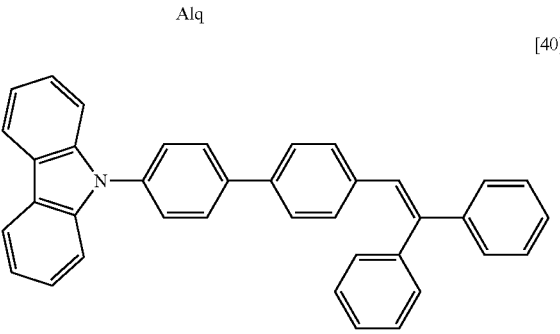

Czl

Comparative Example 2

Case where the Affinity Level of an Electron Barrier Layer is Equivalent to that of an Emitting Layer A device was fabricated in the same manner as in Example 1 except for the following. A 5 nm thick DPVDPAN film was formed on a first emitting layer to obtain a non-doped layer (IP/Af (eV)=5.66/2.73) that did not work as an electron barrier layer. This device had an emission luminance of 100 cd/m² at a DC voltage of 6.5 V and an efficiency of 6 cd/A, which was not satisfactory. The chromaticity was (0.280, 0.282), and white emission was obtained. However, the chromaticity difference between before and after 10,000 hours' driving was large as compared with those in Examples 1 to 3. FIG. 5(b) shows an energy level diagram of the electron barrier layer and layers on both sides thereof in Comparative Example 2.

Comparative Example 3

Case where the Affinity Level of an Electron Barrier Layer is Greater than that of an Emitting Layer A device was fabricated in the same manner as in Example 1 except for the following. A 5 nm thick TZA film represented by [41] was formed on a first emitting layer to obtain an electron barrier layer (IP/Af (eV)=6.30/2.88). This device had an emission luminance of 98 cd/m² at a DC voltage of 8.5 V and an efficiency of 9 cd/A. The chromaticity was (0.281, 0.282), and white emission was obtained. However, the chromaticity difference between before and after 10,000 hours' driving was very large as compared with those in Examples 1 to 3. FIG. 5(c) shows an energy level diagram of the electron barrier layer and layers on both sides thereof in Comparative Example 3.

[41]

TAZ

Comparative Example 4

Case where the Ionization Potential of an Electron Barrier Layer is Smaller than that of a First Emitting Layer A device was fabricated in the same manner as in Example 1 except for the following. A 5 nm thick TCTA film represented by [42] was formed on a first emitting layer to obtain an electron barrier layer (IP/Af (eV)=5.63/2.28). This device had an emission luminance of 105 cd/m² at a DC voltage of 7.0 V and an efficiency of 7 cd/A. The chromaticity was (0.283, 0.281), and white emission was obtained. However, the chromaticity difference between before and after 10,000 hours' driving was very large as compared with those in Examples 1 to 3. FIG. 5(d) shows an energy level diagram of the electron barrier layer and layers on both sides thereof in Comparative Example 4.

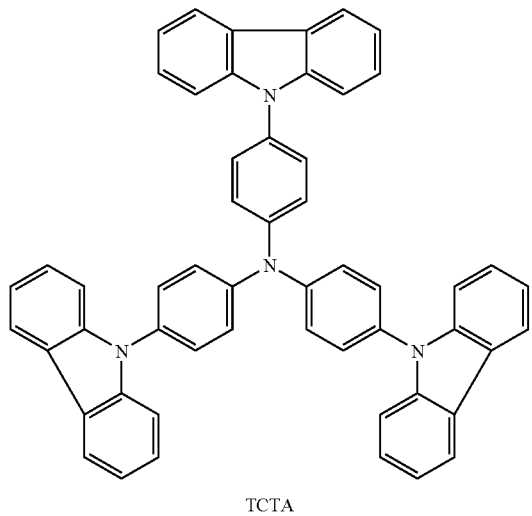

[42]

TCTA

Comparative Example 5

Case where No Electron Barrier Layer is Present

A device was fabricated in the same manner as in Example 1 except for the following. A second emitting layer was formed on a first emitting layer, and no electron barrier layer was formed. The chromaticity of this device was (0.282, 0.281), and white emission was obtained. However, the chromaticity difference between before and after 10,000 hours' driving was very large as compared with those in Examples 1 to 3.

Example 4

A 25 mm×75 mm and 1.1 mm thick glass substrate with an ITO transparent electrode (anode) (supplied by GEOMATEC CO., LTD.) was subjected to ultrasonic cleaning in isopropyl alcohol for 5 minutes and then subjected to UV ozone cleaning for 30 minutes. The cleaned glass substrate with transparent electrode lines was fitted to a substrate holder of a vacuum vapor deposition apparatus. First, a 60 nm thick TPD 232 film was formed on the surface thereof on which the transparent electrode lines were formed so as to cover the above transparent electrode. The TPD 232 film worked as a hole injecting layer. The formation of the TPD232 film was followed by formation of 20 nm thick NPD film on the TPD232 film. The NPD film worked as a hole transporting layer.

Further, the formation of the NPD film was followed by formation of a 10 nm thick film, which was formed by vapor deposition of a styryl derivative DPVDPAN of the formula [32] and B1 of the formula [33] at a weight ratio of 40:1, to obtain a first emitting layer (IP/Af (eV)=5.66/2.73). This first emitting layer emits light in blue. Then, a 5 nm thick titanium oxide film was formed. This titanium oxide film worked as an electron barrier layer (IP/Af (eV)=6.21/2.01). Then, a 30 nm thick film was formed by vapor deposition of a styryl derivative DPVDPAN and R1 (fluorescence peak wavelength 545 nm) of the formula [35] at a weight ratio of 40:1, to obtain a yellow to red emitting layer (Af=2.73). On this film was formed a 10 nm thick Alq film as an electron-transporting layer. Then, Li (Li source: supplied by Saes getter Co., Ltd.) and Alq were vapor co-deposited to form a 10 nm thick Alq:Li film as an electron-injecting layer. Then, a metal cathode was formed on this Alq:Li film by vapor deposition of metal Al to a thickness of 150 nm, to form an organic EL device.

It was found that the above device had an emission luminance of 100 cd/m² at a DC voltage of 6.5 V and an efficiency of 13 cd/A. Light from the device made of the materials has CIE1931 chromaticity coordinates of (x,y)=(0.282, 0.280) and was white. The chromaticity difference between before and after the 10,000 hours' driving was (0.011, 0.012), so that the device was found to be excellent. The organic EL device of this Example had high luminous efficiency and small change in color as compared with conventional devices. Further, when the titanium oxide was replaced with germanium oxide, silicon oxide or lithium fluoride, equal performances were obtained.

Example 5

A 25 mm×75 mm and 1.1 mm thick glass substrate with an ITO transparent electrode (anode) (supplied by GEOMATEC CO., LTD.) was subjected to ultrasonic cleaning in isopropyl alcohol for 5 minutes and then subjected to UV ozone cleaning for 30 minutes. The cleaned glass substrate with transparent electrode lines was fitted to a substrate holder of a vacuum vapor deposition apparatus. First, a 60 nm thick TPD 232 film was formed on the surface thereof on which the transparent electrode lines were formed so as to cover the above transparent electrode. The TPD 232 film worked as a hole injecting layer. The formation of the TPD232 film was followed by formation of 20 nm thick NPD film on the TPD232 film. The NPD film worked as a hole transporting layer.

Further, the formation of the NPD film was followed by formation of a 10 nm thick film, which was formed by vapor deposition of a styryl derivative DPVDPAN of the formula [32] and B1 of the formula [33] at a weight ratio of 40:1, to obtain a first emitting layer (IP/Af (eV)=5.66/2.73). This first emitting layer emits light in blue. Then, a 5 nm thick CPB film represented by [34] was formed. This CPB film worked as an electron barrier layer (IP/Af (eV)=5.86/2.41). Then, a 30 nm thick film was formed by vapor deposition of a carbazole derivative of the formula [43] and an iridium complex of the formula [44] at a weight ratio of 30:1.5, to obtain a red emitting layer (Af (eV)=2.55). On this film was formed a 10 nm thick tris(8-quinolinol)aluminum film (to be abbreviated as "Alq film" hereinafter) as an electron-transporting layer. Then, Li (Li source: supplied by Saes getter Co., Ltd.) and Alq were vapor co-deposited to form a 10 nm thick Alq:Li film as an electron-injecting layer. Then, a metal cathode was formed on this Alq:Li film by vapor deposition of metal Al to a thickness of 150 nm, to form an organic EL device.

It was found that the above device had an emission luminance of 101 cd/m$^2$ at a DC voltage of 8.5 V and an efficiency of 12 cd/A. Light from the device made of the materials has CIE1931 chromaticity coordinates of (x,y)=(0.301, 0.281) and was white. When this device was driven at a constant current at an initial luminance of 1,000 cd/m$^2$, the lifetime thereof was excellent 5,000 hours. The chromaticity thereof after 5,000 hours' driving was (0.287, 0.266), and the chromaticity difference between before and after the 5,000 hours' driving was (−0.014, −0.015), so that the device was found to be excellent. The organic EL device of this Example had high luminous efficiency and small change in color as compared with conventional devices.

[43]

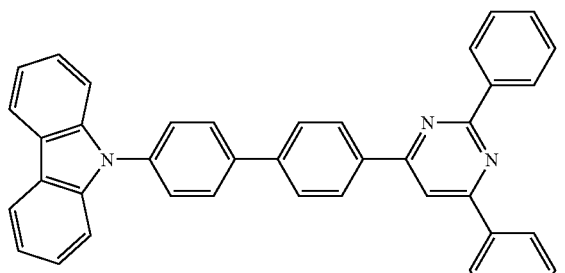

[44]

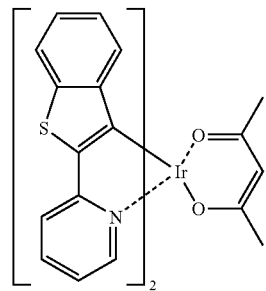

Example 6

A 25 mm×75 mm and 1.1 mm thick glass substrate with an ITO transparent electrode (anode) (supplied by GEOMATEC CO., LTD.) was subjected to ultrasonic cleaning in isopropyl alcohol for 5 minutes and then subjected to UV ozone cleaning for 30 minutes. The cleaned glass substrate with transparent electrode lines was fitted to a substrate holder of a vacuum vapor deposition apparatus. First, a 60 nm thick TPD 232 film was formed on the surface thereof on which the transparent electrode lines were formed so as to cover the above transparent electrode. The TPD 232 film worked as a hole injecting layer. The formation of the TPD232 film was followed by formation of 20 nm thick NPD film on the TPD232 film. The NPD film worked as a hole transporting layer.

Further, the formation of the NPD film was followed by formation of a 10 nm thick film, which was formed by vapor deposition of a styryl derivative DPVDPAN of the formula [32] and B1 of the formula [33] at a weight ratio of 40:1, to obtain a first emitting layer (IP/Af (eV)=5.66/2.73). This first emitting layer emits light in blue. Then, a 5 nm thick film was formed by vapor deposition of CBP represented by [34] and an iridium complex of the formula [44] at a weight ratio of 30:1.5, to obtain an electron blocking and red emitting layer (IP/Af (eV)=5.86/2.41). Then, a 30 nm thick film was formed by vapor deposition of a carbazole derivative of the formula [42] and an iridium complex of the formula [45] at a weight ratio of 30:1.5, to obtain a green emitting layer (Af (eV)= 2.55). On this film was formed a 10 nm thick tris(8-quinolinol)aluminum film (to be abbreviated as "Alg film" hereinafter) as an electron-transporting layer. Then, Li (Li source: supplied by Saes getter Co., Ltd.) and Alq were vapor co-deposited to form a 10 nm thick Alq:Li film as an electron-injecting layer. Then, a metal cathode was formed on this Alq:Li film by vapor deposition of metal Al to a thickness of 150 nm, to form an organic EL device.

It was found that the above device had an emission luminance of 95 cd/m$^2$ at a DC voltage of 8.5 V and an efficiency of 13 cd/A. Light from the device made of the materials has CIE1931 chromaticity coordinates of (x,y)=(0.300, 0.295) and was white. When this device was driven at a constant current with an initial luminance of 1,000 cd/m$^2$, the lifetime thereof was 6,000 hours, and the device was excellent. The chromaticity thereof after 6,000 hours' driving was (0.289, 0.282), and the chromaticity difference between before and after the 6,000 hours' driving was (−0.011, −0.013), so that the device was found to be excellent. The organic EL device of this Example had high luminous efficiency and small change in color as compared with conventional devices.

[45]

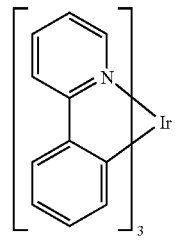

Example 7

A 25 mm×75 mm and 1.1 mm thick glass substrate with an ITO transparent electrode (anode) (supplied by GEOMATEC CO., LTD.) was subjected to ultrasonic cleaning in isopropyl alcohol for 5 minutes and then subjected to UV ozone cleaning for 30 minutes. The cleaned glass substrate with transparent electrode lines was fitted to a substrate holder of a vacuum vapor deposition apparatus. First, a 60 nm thick TPD232 film was formed on the surface thereof on which the transparent electrode lines were formed so as to cover the above transparent electrode. The TPD 232 film worked as a hole injecting layer. The formation of the TPD232 film was followed by formation of 20 nm thick NPD film on the TPD232 film. The NPD film worked as a hole transporting layer.

Further, the formation of the NPD film was followed by formation of a 10 nm thick film, which was formed by vapor deposition of 4,4'-bis(2,2-diphenylvinyl)biphenyl (DPVBi) (hole mobility: $8\times10^{-4}$ cm$^2$/v·s) of the formula [46] and 4,4'-bis(diphenylamino)stilbene (DPAVB) of the formula [47] at a weight ratio of 40:1, to obtain a first emitting layer (IP/Af (eV)=5.65/2.57). This first emitting layer emits light in blue. Then, a 5 nm thick CBP film represented by [34] was formed. This CBP film worked as an electron barrier layer (IP/Af (eV)=5.86/2.41). Then, a 30 nm thick film was formed by vapor deposition of Alq (electron mobility: $1\times10^{-6}$ cm$^2$/v·s) of the formula [39] and R1 (fluorescence peak wavelength 545 nm) of the formula [35] at a weight ratio of 40:1, to obtain a yellow to red emitting layer (Af (eV)=3.00). On this film was formed a 10 nm thick Alq film as an electron-transporting layer. Then, Li (Li source: supplied by Saes getter Co., Ltd.) and Alq were vapor co-deposited to form a 10 nm thick Alq:Li film as an electron-injecting layer. Then, a metal cathode was formed on this Alq:Li film by vapor deposition of metal Al to a thickness of 150 nm, to form an organic EL device.

It was found that the above device had an emission luminance of 99 cd/m$^2$ at a DC voltage of 6.5 V and an efficiency of 11 cd/A. Light from the device made of the materials has CIE1931 chromaticity coordinates of (x,y)=(0.298, 0.305) and was white. When this device was driven at a constant current at an initial luminance of 1,000 cd/m$^2$, the lifetime thereof was excellent 10,000 hours. The chromaticity thereof after 10,000 hours' driving was (0.308, 0.317), and the chromaticity difference between before and after the 10,000 hours' driving was (0.010, 0.012), so that the device was found to be excellent. The organic EL device of this Example had high luminous efficiency and small change in color as compared with conventional devices.

TABLE 1

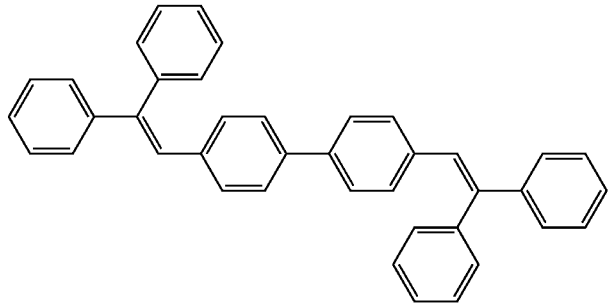

DPVBi [46]

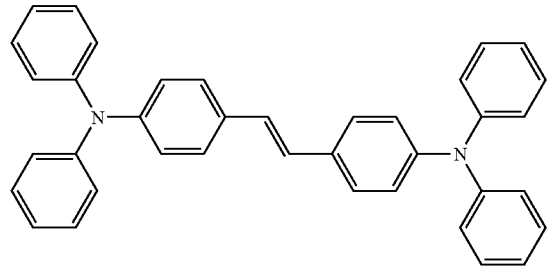

DPAVB [47]

| | IP/Af in the first emitting layer (eV) | IP/Af in the electron barrier layer (eV) | Af in the second emitting layer (eV) | Initial chromaticity | Luminous efficiency (cd/A) | Chromaticity change after 10,000 hours' driving |
|---|---|---|---|---|---|---|
| Example 1 | 5.66/2.73 (DPVDPAN:B1) | 5.86/2.41 (CBP) | 2.73 (DPVDPAN:R1) | (0.281, 0.281) | 14 | (0.010, 0.009) |
| Example 2 | 5.66/2.73 | 5.90/2.41 (CzTT) | 2.73 | (0.293, 0.282) | 13 | (0.012, 0.011) |
| Example 3 | 5.66/2.73 | 5.93/2.20 (BCP/NPD) | 2.73 | (0.295, 0.281) | 16 | (0.008, 0.007) |
| Comparative example 1 | 5.66/2.73 | 5.70/2.65 (Alq/Czl) | 2.73 | (0.286, 0.283) | 8 | (0.018, 0.022) |
| Comparative example 2 | 5.66/2.73 | 5.66/2.73 (DPVDPAN) | 2.73 | (0.280, 0.282) | 6 | (0.016, 0.020) |
| Comparative Example 3 | 5.66/2.73 | 6.30/2.88 (TAZ) | 2.73 | (0.281, 0.282) | 9 | (0.036, 0.052) |
| Comparative example 4 | 5.66/2.73 | 5.63/2.28 (TCTA) | 2.73 | (0.283, 0.281) | 7 | (0.042, 0.048) |
| Comparative example 5 | 5.66/2.73 | (none) | 2.73 | (0.282, 0.281) | 7 | (0.015, 0.015) |
| Example 4 | 5.66/2.73 | 6.21/2.01 (TiO$_2$) | 2.73 | (0.282, 0.280) | 13 | (0.011, 0.012) |

TABLE 1-continued

| Example 5 | 5.66/2.73 | 5.86/2.41 (CBP) | 2.55 ([43]:[44]) | (0.301, 0.281) | 12 | (−0.014, −0.015)* |
| Example 6 | 5.66/2.73 | 5.86/2.41 (CBP:[44]) | 2.55 ([42]:[45]) | (0.300, 0.295) | 13 | (−0.011, −0.013)* |
| Example 7 | 5.65/2.57 (DPVBi:DPAVB) | 5.86/2.41 (CBP) | 3.00 (Alq:R1) | (0.298, 0.305) | 11 | (0.010, 0.012) |

*Chromaticity change after 5,000 hours' driving in Example 5, Chromaticity change after 6,000 hours' driving in Example 6

INDUSTRIAL UTILITY

The organic EL device of the invention has high luminous efficiency and has little change in chromaticity, so that it can be applied to various displays (such as commercial and industrial displays, specifically, various mono-color or full color displays such as a cellular phone, PDA, an automobile navigation system, TV, etc.), various illumination (backlight, etc.) and the like.

The invention claimed is:

1. An organic electroluminescent device comprising in sequence an anode, a first emitting layer, a first carrier barrier layer, a second carrier barrier layer, a second emitting layer and a cathode stacked,
the first carrier barrier layer and second carrier barrier layer being in contact with each other;
wherein an ionization potential of the first carrier barrier layer is more than the ionization potential of the first emitting layer by 0.1 eV or more and an affinity level of the second carrier barrier layer is less than the affinity level of the second emitting layer by 0.1 eV or more.

2. The organic electroluminescent device according to claim 1, wherein the ionization potential of the first carrier barrier layer is more than the ionization potential of the first emitting layer by 0.2 eV or more and the affinity level of the second carrier barrier layer is less than the affinity level of the second emitting layer by 0.2 eV or more.

3. The organic electroluminescent device according to claim 1, wherein the first emitting layer comprises a first dopant for a first emission color and the second emitting layer comprises a second dopant for a second emission color.

4. The organic electroluminescent device according to claim 3, wherein at least one carrier barrier layer comprises a third dopant for a third emission color.

5. The organic electroluminescent device according to claim 4, wherein the first, second and third dopants are selected from the group consisting of blue, green and red.

6. The organic electroluminescent device according to claim 1, wherein the first emitting layer emits blue or red light.

7. The organic electroluminescent device according to claim 1, wherein the second emitting layer emits blue or red light.

8. The organic electroluminescent device according to claim 1, wherein one of the first emitting layer and the second emitting layer emits blue light, and another emitting layer emits red light.

9. The organic electroluminescent device according to claim 1, wherein the first emitting layer comprises a hole-transporting material and the second emitting layer comprises an electron-transporting material.

10. An organic electroluminescent device comprising in sequence an anode, a first emitting layer, a first carrier barrier layer, a second carrier barrier layer, a second emitting layer and a cathode stacked;
the first emitting layer and/or the second emitting layer comprising a compound represented by the general formulas [9] or [10];
wherein an ionization potential of the first carrier barrier layer is more than the ionization potential of the first emitting layer by 0.1 eV or more and an affinity level of the second carrier barrier layer is less than the affinity level of the second emitting layer by 0.1 eV or more,

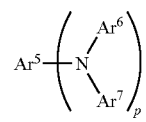
[9]

wherein $Ar^5$, $Ar^6$, and $Ar^7$ are independently a substituted or unsubstituted aromatic group with 6 to 40 carbon atoms; at least one of them includes a styryl group and p is an integer of 1 to 3,

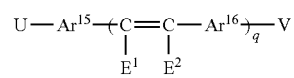
[10]

wherein $Ar^{15}$ and $Ar^{16}$ are independently an arylene group with 6 to 30 carbon atoms; $E^1$ and $E^2$ are independently an aryl or alkyl group with 6 to 30 carbon atoms, a hydrogen atom, or a cyano group; q is an integer of 1 to 3; U and/or V are a substituent including an amino group and the amino group is preferably an arylamino group.

11. The organic electroluminescent device according to claim 10, wherein the ionization potential of the first carrier barrier layer is more than the ionization potential of the first emitting layer by 0.2 eV or more and the affinity level of the second carrier barrier layer is less than the affinity level of the second emitting layer by 0.2 eV or more.

12. The organic electroluminescent device according to claim 10, wherein the first emitting layer comprises a first dopant for a first emission color and the second emitting layer comprises a second dopant for a second emission color.

13. The organic electroluminescent device according to claim 12, wherein at least one carrier barrier layer comprises a third dopant for a third emission color.

14. The organic electroluminescent device according to claim 13, wherein the first, second and third dopants are selected from the group consisting of blue, green and red.

15. The organic electroluminescent device according to claim 10, wherein the first emitting layer emits blue or red light.

16. The organic electroluminescent device according to claim 10, wherein the second emitting layer emits blue or red light.

17. The organic electroluminescent device according to claim 10, wherein one of the first emitting layer and the second emitting layer emits blue light, and another emitting layer emits red light.

18. The organic electroluminescent device according to claim 10, wherein the first emitting layer comprises a hole-transporting material and the second emitting layer comprises an electron-transporting material.

* * * * *